(12) United States Patent
Kim et al.

(10) Patent No.: US 10,649,599 B2
(45) Date of Patent: May 12, 2020

(54) ELECTRONIC DEVICE FOR DETECTING PROXIMITY OF USER AND OPERATION METHOD THEREOF

(71) Applicant: Samsung Electronics Co., Ltd., Gyeonggi-do (KR)

(72) Inventors: Seon-Jun Kim, Gyeonggi-do (KR); Dongil Yang, Gyeonggi-do (KR); Hyoseok Na, Gyeonggi-do (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 16 days.

(21) Appl. No.: 16/021,237

(22) Filed: Jun. 28, 2018

(65) Prior Publication Data
US 2019/0004628 A1 Jan. 3, 2019

(30) Foreign Application Priority Data
Jun. 30, 2017 (KR) ........................ 10-2017-0083740

(51) Int. Cl.
*G06F 3/044* (2006.01)
*H03K 17/955* (2006.01)
(Continued)

(52) U.S. Cl.
CPC .............. *G06F 3/044* (2013.01); *G01V 3/088* (2013.01); *H03K 17/955* (2013.01);
(Continued)

(58) Field of Classification Search
CPC ........... G06F 3/044; G06F 2203/04101; G06F 2203/04108; H03K 17/955; H03K 17/962; G01V 3/088
See application file for complete search history.

(56) References Cited

U.S. PATENT DOCUMENTS 3,575,640 A * 4/1971 Ishikawa .............. H03K 17/955
361/181
8,055,305 B2 11/2011 Cho et al.
(Continued)

FOREIGN PATENT DOCUMENTS

KR 2002-0063353 A 8/2002
KR 2003-0085300 A 11/2003
(Continued)

OTHER PUBLICATIONS

European Search Report dated Nov. 16, 2018.

*Primary Examiner* — Laurence J Lee
(74) *Attorney, Agent, or Firm* — Cha & Reiter, LLC

(57) ABSTRACT

Various embodiments of the present disclosure relate to an electronic device for using an amplifier to detect whether a user body is close to the electronic device and an operation method thereof. An electronic device according to an embodiment of the present disclosure may include: an antenna configured to be at least a part of an exterior of the electronic device; a variable element that has a capacitance in a designated range; and an amplifier connected to the variable element and configured to amplify a voltage of the variable element by a designated ratio and output an amplified voltage, wherein the capacitance of the variable element and the designated ratio may be configured so that a difference between a voltage of the antenna and the amplified voltage of the amplifier is smaller than a designated threshold value.

19 Claims, 9 Drawing Sheets

(51) Int. Cl.
    *G01V 3/08*     (2006.01)
    *H03K 17/96*     (2006.01)

(52) U.S. Cl.
    CPC . *H03K 17/962* (2013.01); *G06F 2203/04108* (2013.01); *H04M 2250/12* (2013.01)

(56) References Cited

U.S. PATENT DOCUMENTS

| | | | |
|---|---|---|---|
| 8,175,590 | B2 | 5/2012 | Hamel et al. |
| 8,731,718 | B2 | 5/2014 | Rodnick |
| 9,124,273 | B2 | 9/2015 | Unterreitmayer |
| 9,189,127 | B2 | 11/2015 | Lee et al. |
| 9,223,540 | B2 | 12/2015 | Park |
| 9,236,860 | B2 | 1/2016 | Unterreitmayer et al. |
| 9,425,846 | B2 | 8/2016 | Kim et al. |
| 9,437,469 | B2 | 9/2016 | DiBella et al. |
| 9,575,557 | B2 | 2/2017 | Tartz et al. |
| 9,727,161 | B2 | 8/2017 | Hinckley et al. |
| 9,836,275 | B2 | 12/2017 | Cha et al. |
| 2002/0109035 | A1* | 8/2002 | Denen ................ A47K 10/3687 242/559.1 |
| 2004/0051396 | A1 | 3/2004 | Supper et al. |
| 2008/0139969 | A1 | 1/2008 | Gough et al. |
| 2013/0249750 | A1* | 9/2013 | Matsui .................. H01Q 1/242 343/745 |
| 2015/0150633 | A1 | 6/2015 | Castro et al. |
| 2015/0324070 | A1 | 11/2015 | Kim et al. |
| 2015/0363034 | A1 | 12/2015 | Hinckley et al. |
| 2016/0066939 | A1 | 3/2016 | Castro et al. |

FOREIGN PATENT DOCUMENTS

| | | | |
|---|---|---|---|
| KR | 10-2005-0006443 | A | 1/2005 |
| KR | 10-2005-0053126 | A | 6/2005 |
| KR | 10-2007-0001440 | A | 1/2007 |
| KR | 10-2007-0029220 | A | 3/2007 |
| KR | 10-2007-0071537 | A | 7/2007 |
| KR | 10-2010-0007022 | A | 1/2010 |
| KR | 10-2010-0023821 | A | 3/2010 |
| KR | 10-2010-0068256 | A | 6/2010 |
| KR | 10-2011-0047926 | A | 5/2011 |
| KR | 10-2011-0083861 | A | 7/2011 |
| KR | 20-2011-0009527 | U | 10/2011 |
| KR | 10-2012-0005495 | A | 1/2012 |
| KR | 10-2012-0082575 | A | 7/2012 |
| KR | 10-2012-0103673 | A | 9/2012 |
| KR | 10-2012-0134311 | A | 12/2012 |
| KR | 10-2012-0137160 | A | 12/2012 |
| KR | 10-2013-0059123 | A | 6/2013 |
| KR | 10-2013-0068250 | A | 6/2013 |
| KR | 10-2013-0142139 | A | 12/2013 |
| KR | 10-2014-0027229 | A | 3/2014 |
| KR | 10-2014-0054960 | A | 5/2014 |
| KR | 10-2014-0126020 | A | 10/2014 |
| KR | 10-2015-0051315 | A | 5/2015 |
| KR | 10-1515428 | B1 | 5/2015 |
| KR | 10-2015-0117962 | A | 10/2015 |
| KR | 10-2015-0123858 | A | 11/2015 |
| KR | 10-2015-0127989 | A | 11/2015 |
| KR | 10-2015-0137827 | A | 12/2015 |
| KR | 10-2015-0143671 | A | 12/2015 |
| KR | 10-2016-0024453 | A | 3/2016 |
| KR | 10-2016-0112543 | A | 9/2016 |
| KR | 10-2017-0016472 | A | 2/2017 |
| KR | 10-2017-0016869 | A | 2/2017 |
| WO | 2014/036532 | A1 | 3/2014 |
| WO | 2014/130353 | A1 | 8/2014 |

\* cited by examiner

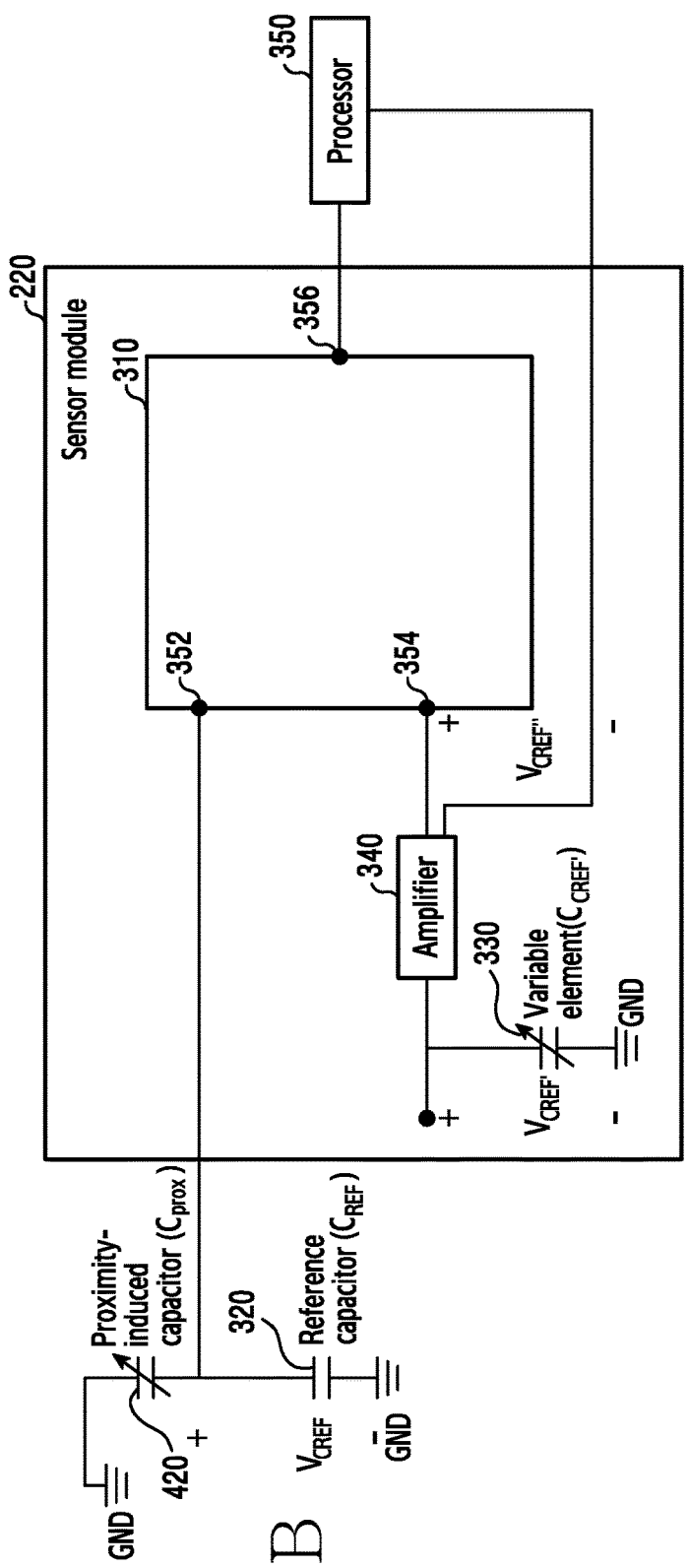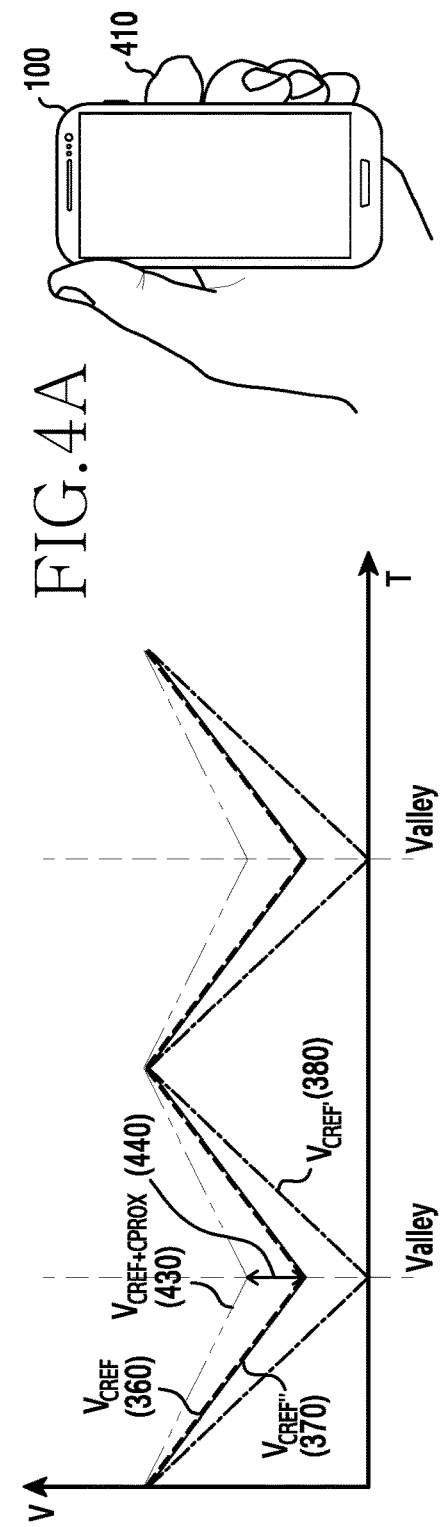
FIG.4B
FIG.4A
FIG.4C

ELECTRONIC DEVICE FOR DETECTING PROXIMITY OF USER AND OPERATION METHOD THEREOF

CROSS-REFERENCE TO RELATED APPLICATION(S)

This application is based on and claims priority under 35 U.S.C. § 119 to Korean Patent Application No. 10-2017-0083740, filed on Jun. 30, 2017, in the Korean Intellectual Property Office, the disclosure of which is incorporated by reference herein in its entirety.

BACKGROUND

1) Field

Various embodiments of the present disclosure generally relate to an electronic device and a method for detecting whether a user body is close to the device.

2) Description of Related Art

Portable electronic devices, such as smartphones, provides complex functions and services such as games, messaging services, text editing, image/video reproducing and editing in addition to basic services such as making phone calls and transceiving text messages. To perform these basic and complex functions, these devices require high-performance hardware. The electronic devices described above may include various types of sensors that detect various states of the electronic devices. For example, a portable electronic device may include a sensor module configured to detect whether the device is held by a user hand or is approached by a user body.

The above information is presented as background information only to assist with an understanding of the present disclosure. No determination has been made, and no assertion is made, as to whether any of the above might be applicable as prior art with regard to the present disclosure.

SUMMARY

According to one or more embodiment of the present disclosure, an electronic device may include at least one capacitor in order to detect whether a user body is close. The at least one capacitor may use a metal antenna radiator disposed on the exterior of the electronic device, which may function as a sensing member configured to detect whether the user body is close. The electronic device may determine whether the user body is close based on the change of capacitance incurred by the proximity of the user body to the metal antenna radiator.

In addition, the electronic device may be required to include a separate variable capacitor different from the at least one capacitor in order to detect change of capacitance incurred by the proximity of the user body. The capacitance range of the separate variable capacitor need to include the capacitance of the at least one capacitor. And the larger the capacitance range of the variable capacitor is required in the electronic device, the wider the mounting space for the variable capacitor is required in the electronic device. This may present a limit or a bottleneck in the design of the electronic device.

An aspect of the various embodiments of the present disclosure is to provide a device and a method for sensing change of a capacitance beyond a capacitance range of a variable capacitor.

The technical subjects and advantages pursued in the present disclosure may not be limited to the above mentioned technical subjects, and other technical subjects which are not mentioned may be clearly understood, through the following descriptions, by those skilled in the art of the present disclosure.

An electronic device according to an embodiment of the present disclosure may include: an antenna configured to be at least a part of an exterior of the electronic device; a variable element that has a capacitance in a designated range; and an amplifier connected to the variable element and configured to amplify a voltage of the variable element by a designated ratio and output an amplified voltage, wherein the capacitance of the variable element and the designated ratio may be configured so that a difference between a voltage of the antenna and the amplified voltage of the amplifier is smaller than a designated threshold value.

An electronic device according to an embodiment of the present disclosure may include: an antenna; a variable element that has a capacitance in a designated range; and an amplifier connected to the variable element and configured to amplify a voltage of the variable element by a designated ratio and output an amplified voltage, wherein the capacitance of the variable element and the designated ratio may be configured so that a difference between a voltage of the antenna and the amplified voltage of the amplifier is smaller than a designated threshold value.

An operation method of an electronic device including an antenna disposed on at least a part of an exterior thereof according to various embodiments of the present disclosure may include: identifying a change rate during a predetermined time interval of an output voltage of an amplifier configured to amplify, by a designated ratio, a voltage of a variable element that has a capacitance in a designated range; identifying a change rate during the predetermined time interval of a voltage of a reference capacitor serving as an equivalent circuit for an antenna; determining whether the identified change rate of the output voltage of the amplifier is greater than the change rate of the voltage of the reference capacitor during the predetermined time interval; and changing the designated ratio of the amplifier in accordance with the determination that the identified change rate of the output voltage of the amplifier is greater than the change rate of the voltage of the reference capacitor during the predetermined time interval.

BRIEF DESCRIPTION OF THE DRAWINGS

The above and other aspects, features, and advantages of certain embodiments of the present disclosure will be more apparent from the following description taken in conjunction with the accompanying drawings, in which:

FIG. 4A is a view illustrating an electronic device according to an embodiment of the present disclosure;

FIG. 4B is a block diagram illustrating a sensor module according to an embodiment of the present disclosure;

FIG. 4C is a graph illustrating changes of various voltages when proximity of a user body is detected according to an embodiment of the present disclosure;

DETAILED DESCRIPTION

Figure 1:
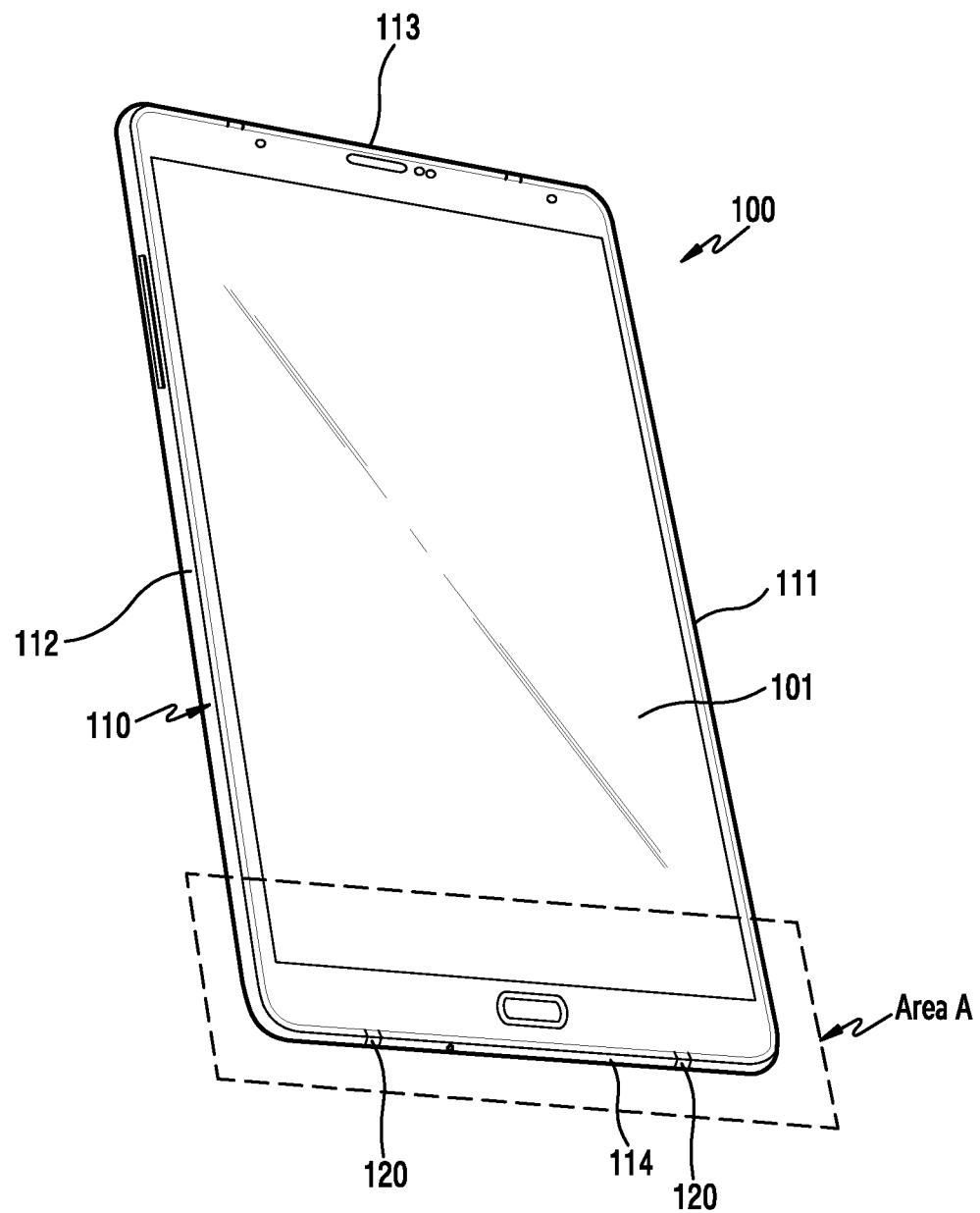
FIG. 1 is a perspective view illustrating an electronic device according to an embodiment of the present disclosure.

Hereinafter, various embodiments of the present disclosure will be described with reference to the accompanying drawings. The embodiments and the terms used therein are not intended to limit the technology disclosed herein to specific forms, and should be understood to include various modifications, equivalents, and/or alternatives to the corresponding embodiments. In describing the drawings, similar reference numerals may be used to designate similar elements. A singular expression may include a plural expression unless they are definitely different in a context. In the present disclosure, the expression "A or B," or "at least one of A or/and B" may include all possible combinations of the items listed. The expression "a first," "a second," "the first," or "the second" may refer to corresponding components without implying an order of importance, and are used merely to distinguish each component from the others without unduly limiting the components. When an element (e.g., first element) is referred to as being "(functionally or communicatively) coupled" or "connected" to another element (e.g., second element), the element (e.g., first element) may be connected directly to the another element (e.g., second element) or connected to the another element (e.g., second element) through yet another element (e.g., third element).

The expression "configured to (adapted to)" as used in the present disclosure may be interchangeably used with, for example, "suitable for," "having the capacity to," "modified to," "made to," "capable of," or "designed to" in terms of hardware or software, according to circumstances. In some situations, the expression "device configured to" may mean that the device, together with other devices or components, "is able to." For example, the phrase "processor adapted (or configured) to perform A, B, and C" may mean a dedicated processor (e.g., embedded processor) only for performing the corresponding operations or a generic-purpose processor (e.g., Central Processing Unit (CPU) or Application Processor (AP)) that can perform the corresponding operations by executing one or more software programs stored in a memory device.

An electronic device according to various embodiments of the present disclosure may include at least one of, for example, a smart phone, a tablet Personal Computer (PC), a mobile phone, a video phone, an electronic book reader (e-book reader), a desktop PC, a laptop PC, a netbook computer, a workstation, a server, a Personal Digital Assistant (PDA), a Portable Multimedia Player (PMP), an MPEG-1 audio layer-3 (MP3) player, a mobile medical device, a camera, and a wearable device. The wearable device may include at least one of an accessory type (e.g., a watch, a ring, a bracelet, an anklet, a necklace, a glasses, a contact lens, or a Head-Mounted Device (HMD)), a fabric or clothing integrated type (e.g., an electronic clothing), a body-mounted type (e.g., a skin pad, or tattoo), and a bio-implantable circuit. In some embodiments, the electronic device may include at least one of, for example, a television, a Digital Video Disk (DVD) player, an audio, a refrigerator, an air conditioner, a vacuum cleaner, an oven, a microwave oven, a washing machine, an air cleaner, a set-top box, a home automation control panel, a security control panel, a media box (e.g., Samsung HomeSync™, Apple TV™, or Google TV™), a game console (e.g., Xbox™ and PlayStation™), an electronic dictionary, an electronic key, a camcorder, and an electronic photo frame.

In other embodiments, the electronic device may include at least one of various medical devices (e.g., various portable medical measuring devices (a blood glucose monitoring device, a heart rate monitoring device, a blood pressure measuring device, a body temperature measuring device, etc.), a Magnetic Resonance Angiography (MRA), a Magnetic Resonance Imaging (MRI), a Computed Tomography (CT) machine, an imaging machine, and an ultrasonic machine), a navigation device, a Global Navigation Satellite System (GNSS), an Event Data Recorder (EDR), a Flight Data Recorder (FDR), a Vehicle Infotainment Devices, an electronic devices for a ship (e.g., a navigation device for a ship, and a gyro-compass), avionics, security devices, an automotive head unit, a robot for home or industry, a drone, an Automatic Teller's Machine (ATM) in financial institutions, Point Of Sales (POS) in a shop, or internet device of things (e.g., a light bulb, various sensors, a sprinkler device, a fire alarm, a thermostat, a streetlamp, a toaster, sporting goods, a hot water tank, a heater, a boiler, etc.). According to some embodiments, an electronic device may include at least one of a part of furniture or a building/structure, a vehicle, an electronic board, an electronic signature receiving device, a projector, and various types of measuring instruments (e.g., a water meter, an electric meter, a gas meter, a radio wave meter, and the like). In various embodiments, the electronic device may be flexible, or may be a combination of one or more of the aforementioned various devices. The electronic device according to one embodiment of the present disclosure is not limited to the above described devices. In the present disclosure, the term "user" may indicate a person using an electronic device or a device (e.g., an artificial intelligence electronic device) using an electronic device.

FIG. 1 is a perspective view illustrating an electronic device according to an embodiment of the present disclosure.

Referring to FIG. 1, a display 101 may be installed on a front surface of an electronic device 100. A speaker device configured to output audio, such as the voice of a counter-party during a call, may be installed on an upper side of the display 101. A microphone device configured to detect audio, such as the voice of the user of the electronic device during a call, may be installed on a lower side of the display 101.

According to an embodiment, the electronic device 100 may include a metal bezel 110. According to an embodiment, the metal bezel 110 may be disposed along the outer periphery of the electronic device 100 and may be disposed to extend to at least one area of the rear surface the electronic device 100. According to an embodiment, the metal bezel 110 may include at least one segmenting portion 120. According to an embodiment, bezel parts divided by respective segmenting portions 120 may be utilized as antenna radiators operating in at least one frequency band.

According to an embodiment, the metal bezel 110 may have a loop shape along the outer periphery of the electronic device and may define the entirety or a part of the thickness of the electronic device 100. According to an embodiment, when the electronic device is viewed from the front, the metal bezel 110 may be constituted by a right bezel part 111, a left bezel part 112, an upper bezel part 113, and a lower bezel part 114. Here, the above-described lower bezel part 114 may serve as the bezel part that is formed by a pair of segmenting portions 120.

According to an embodiment, an antenna device may be disposed in the lower side or area (area A) of the electronic device 100. According to an embodiment, the lower bezel part 114 may be used as the main antenna radiator because it is separated from the rest of the bezels by the pair of segmenting portions 120. According to an embodiment, the lower bezel part 114 may serve as an antenna radiator that operates in at least two operating frequency bands, depending on the feeding positions of the antennas. According to an embodiment, the right bezel part 111 or the left bezel part 112 may be electrostatically connected to the lower bezel part 114, thereby also contributing to the radiation performance.

According to an embodiment, the lower bezel part 114 may be used as a sensing member in addition to an antenna radiator. This is because the lower bezel part 114 is made of a metallic material. According to an embodiment, the lower bezel part 114 may be utilized as a sensing member of a sensor module configured to detect whether a user body (e.g. the body of the user) is close. According to an embodiment, the lower bezel part 114 may also be used in connection with an electrocardiogram sensor, a general touch sensor, a temperature sensor (e.g., a probe for a temperature sensor), or an underwater recognition sensor (e.g., a flooding recognition sensor).

According to an embodiment, the configuration of the antenna device of the present disclosure is merely an example, and the above described functions of the lower bezel part 114 may be alternatively performed by the upper bezel part 113, which can be separated by another pair of segmenting portions, or may be performed together with the upper bezel part 113. Also, in relation to the above configuration, if the lower bezel part 114 includes the left bezel part 112 and/or at least a part of the left bezel part 112, the lower bezel part 114 may be separated by another segmenting part formed on the right bezel part 111 and/or the left bezel part 112.

Figure 2:
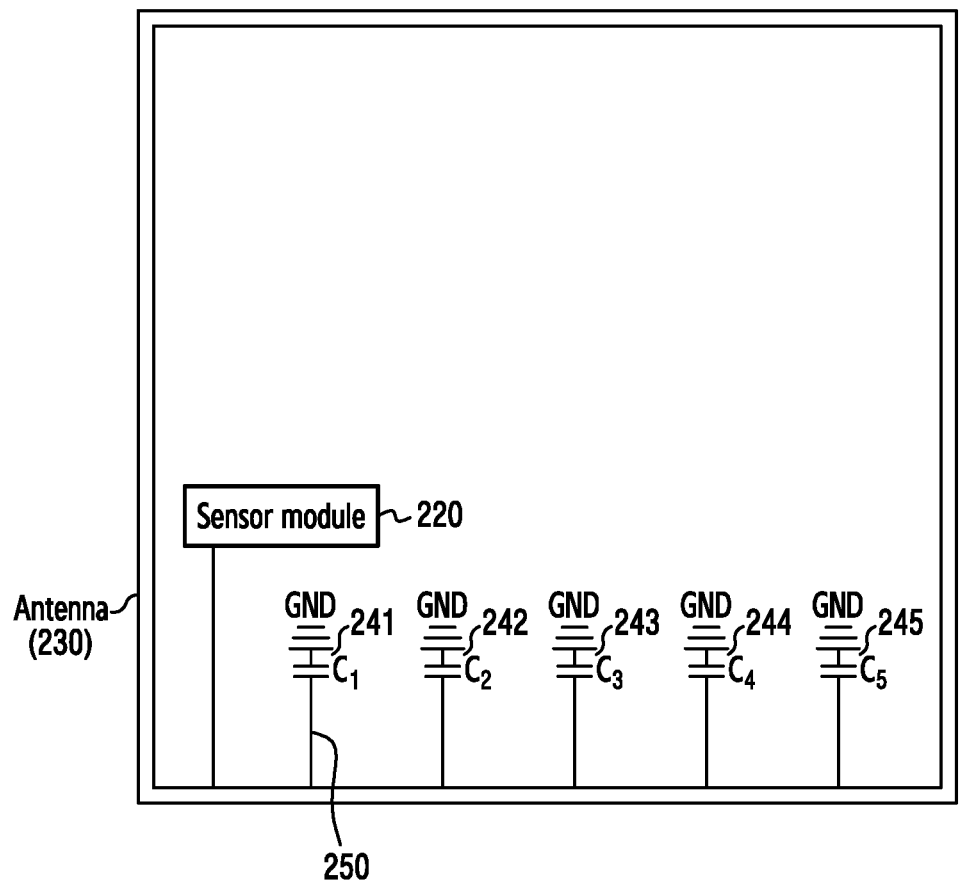
FIG. 2 is a block diagram illustrating an electronic device according to an embodiment of the present disclosure.

FIG. 2 is a block diagram illustrating an electronic device according to an embodiment of the present disclosure.

Referring to FIG. 2, an antenna 230 may be disposed in at least a part of the lower area (area A of FIG. 1) of the electronic device 100. In an embodiment, the antenna 230 may be disposed in at least a part of the exterior of the electronic device 100 that is within the lower area of the electronic device 100. In an embodiment, the antenna 230 may be the antenna radiator described with reference to FIG. 1. That is, the antenna 230 may be the lower bezel part 114 of the metal bezel 110.

In another embodiment, the antenna 230 may be the upper bezel part 113, the right bezel part 111, and/or the left bezel part 112.

In an embodiment, the antenna 230 may be electrically connected to at least one capacitor (C1(241) to C5(245)). In an embodiment, at least one electrical path (e.g. the element designated by reference numeral 250 of FIG. 2), which connects the antenna 230 and a ground GND, may be formed. At least one capacitor (e.g. the element designated by reference numeral 241 of FIG. 2) may be located on at least one electrical path 250.

In an embodiment, the at least one capacitor (C1(241) to C5(245)) may serve to improve the radiation performance of the antenna 230, to enlarge the frequency band usable by the antenna 230, or to prevent electric shock of the user using the electronic device 100.

In an embodiment, a sensor module 220 may detect whether the electronic device 100 is close to the user body based on change of capacitance incurred by the at least one capacitor (C1(241) to C5(245)). For example, the sensor module 220 may be a touch sensor or a grip sensor.

In an embodiment, the sensor module 220 may determine whether a user body is close based on the difference between the capacitance of a variable element (e.g. variable capacitor) disposed in the sensor module 220 and the capacitance of the at least one capacitor (C1(241) to C5(245)). The capacitance of the variable element may be synchronized with the capacitance of the at least one capacitor (C1(241) to C5(245)) and thus may be used as a reference value for detecting the change of the capacitance of the at least one capacitor (C1(241) to C5(245)). In an embodiment, synchronizing the capacitance of the variable element with the capacitance of the at least one capacitor (C1(241) to C5(245)) means configuring the capacitance of the separate variable element to be at a value identical to the equivalent capacitance of the at least one capacitor (C1(241) to C5(245)), or at a value having a difference equal to or lower than a pre-configured value from the equivalent capacitance.

In another embodiment, when the capacitance of the separate variable element located in the sensor module 220 cannot be synchronized with the capacitance of the at least one capacitor (C1(241) to C5(245)), for example due to the limited capacitance range of the variable element, amplifying the voltage of the separate variable element located in the sensor module 220 may allow for synchronization. This is because the change rate of the voltage of the separate variable element during a given predetermined time interval corresponds to the capacitance value of the separate variable element, and when the voltage of the separate variable element is amplified, the change rate of the voltage of the separate variable element is also changed. Therefore, to synchronize the voltage output of the separate variable element located in the sensor module 220 with the voltage output of the at least one capacitor (C1(241) to C5(245)), the voltage of the variable element may be amplified, and the amplified voltage of the variable element may be synchronized with that of the at least one capacitor (C1(241) to C5(245)).

In various embodiments of the present disclosure, a change rate of a voltage during a predetermined time interval may imply a change rate of a voltage for a predetermined time interval.

Although not illustrated, the sensor module 220 may include a sensor module IC that generally controls the operations of the sensor module 220. In an embodiment, the sensor module IC may be disposed outside the sensor module 220. For example, the sensor module IC may be disposed as a part of a Communication Processor (CP) or an Application Processor (AP) that controls the overall operations of the electronic device.

Figure 3A:
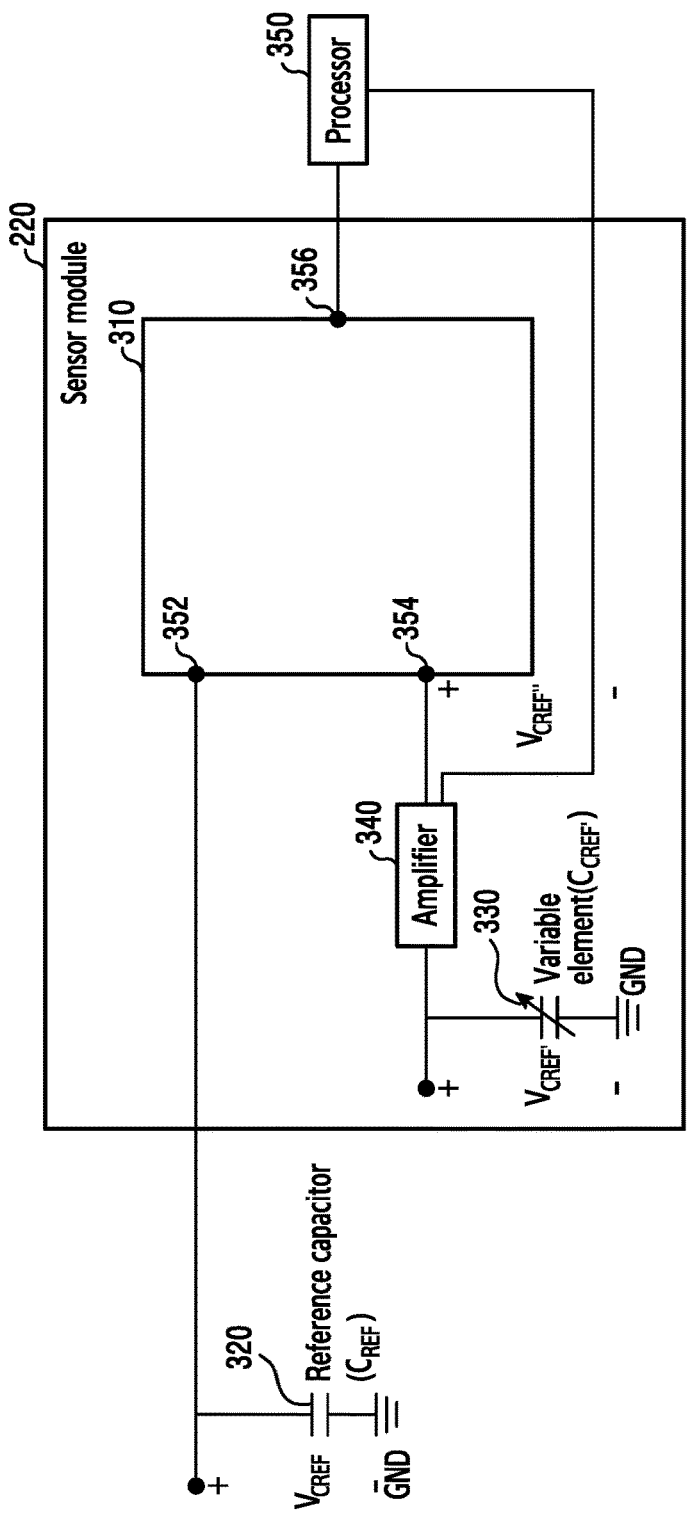
FIG. 3A is a block diagram illustrating a sensor module according to an embodiment of the present disclosure.

FIG. 3A is a block diagram illustrating a sensor module according to an embodiment of the present disclosure.

Referring to FIG. 3A, the sensor module 220 may include a detection circuit 310.

In an embodiment, the detection circuit 310 may be at least a part of a circuit that is configured to amplify the voltage of a separate variable element located in the sensor module 220, thereby synchronizing the voltage output of the separate variable element located in the sensor module 220 with the voltage output of at least one capacitor (C1(241) to C5(245)). The detection circuit 310 may perform the amplification under the control of the processor 350. The reason for synchronizing the voltage output of the separate variable element with the voltage output of at least one capacitor (C1(241) to C5(245)) in this embodiment is so that the system can use the voltage output of the separate variable element as a reference value for detecting change of capacitance of the at least one capacitor (C1(241) to C5(245)). Another reason for amplifying the voltage of the separate variable element is that, when the voltage is not amplified, and when the capacitance range of the separate variable element located in the sensor module 220 does not include the capacitance of at least one capacitor (C1(241) to C5(245)), and it is impossible to synchronize the capacitance of the separate variable element with the capacitance of at least one capacitor (C1(241) to C5(245)). Therefore, voltage amplification may allow for synchronization of the voltage outputs. However, when the voltage of the separate variable element is not amplified, and when capacitance range designated to the separate variable element includes the capacitance of the capacitance of at least one capacitor (C1(241) to C5(245)), synchronization is not an issue, and the amplifying ratio of the amplifier 340 described below may be configured as 1.

The processor 350 may include a microprocessor or any suitable type of processing circuitry, such as one or more general-purpose processors (e.g., ARM-based processors), a Digital Signal Processor (DSP), a Programmable Logic Device (PLD), an Application-Specific Integrated Circuit (ASIC), a Field-Programmable Gate Array (FPGA), a Graphical Processing Unit (GPU), a video card controller, etc. In addition, it would be recognized that when a general purpose computer accesses code for implementing the processing shown herein, the execution of the code transforms the general purpose computer into a special purpose computer for executing the processing shown herein. Certain of the functions and steps provided in the Figures may be implemented in hardware, software or a combination of both and may be performed in whole or in part within the programmed instructions of a computer. No claim element herein is to be construed under the provisions of 35 U.S.C. 112(f), unless the element is expressly recited using the phrase "means for." In addition, an artisan understands and appreciates that a "processor" or "microprocessor" may be hardware in the claimed disclosure. Under the broadest reasonable interpretation, the appended claims are statutory subject matter in compliance with 35 U.S.C. § 101.

In an embodiment, the separate variable element may be a variable element 330, and the equivalent capacitance of at least one capacitor (C1(241) to C5(245)) is shown in FIG. 3A as the reference capacitor 320.

In an embodiment, the detection circuit 310 may be a part of a circuit configured to detect the difference between voltages of two elements synchronized at the same point in time. The two synchronized elements may be the variable element 330 and the reference capacitor 320.

In an embodiment, the detection circuit 310 may include a first input node 352, a second input node 354, and an output node 356. In an embodiment, the first input node 352 may be connected to the reference capacitor 320, and the second input node 354 may be connected to the variable element 330 through the amplifier 340. In an embodiment, an output voltage Vcref" of the amplifier 340 may be the same as an input voltage Vcref" input to the second input node 354 of the detection circuit.

In an embodiment, the output node 356 of the detection circuit 310 may be connected to the processor 350. In an embodiment, the processor 350 may be the sensor module IC described with reference to FIG. 2 and is illustrated as disposed outside the sensor module 220. However, in another embodiment, the processor 350 may be disposed in the sensor module 220.

In an embodiment, the processor 350 may be connected to the output node 356 of the detection circuit 310 and thus may perform operations based on the output signal output from the output node 356. For example, the processor 350 may be the sensor module IC described with reference to FIG. 2. In an embodiment, based on the output signal output from the output node 356 of the detection circuit 310, the processor 350 may determine whether the capacitance of the variable element 330 can be synchronized with the capacitance of the reference capacitor 320 without the change of the amplifying ratio of the amplifier 340. For example, the processor 350 may determine whether synchronization is possible without amplification by comparing the change rate of the output voltage Vcref" of the amplifier 340 during a predetermined time interval to the change rate of a voltage Vcref of the reference capacitor 320.

The reason why the processor 350 compares the change rates of the output voltage Vcref" to the voltage Vcref is that the output voltage Vcref" and the voltage Vcref periodically changes (increases or decreases), and the change rates are dependent on the capacitance of the corresponding element. For example, the voltage Vcref applied to both ends of the reference capacitor 320 may be periodically increased or decreased depending on the control of the processor 350. This is because the processor 350 is configured to periodically perform the operations of discharging (e.g. discharge of electricity) the electric charge stored in the reference capacitor 320 and storing (e.g. charge of electricity) an external electric charge in the reference capacitor 320. By periodically charging or discharging electric charge stored in the reference capacitor 320, the processor 350 may be able to detect whether the user body is close. In another example, the change rate of the voltage Vcref of the reference capacitor 320 during a predetermined time interval, or a ratio (e.g. the slope of Vcref in FIG. 3B) of the increasing or decreasing voltage may be determined depending on the capacitance of the reference capacitor 320. The capacitance of the reference capacitor 320 is constant in time, and thus the change rate of the voltage Vcref of the reference capacitor 320 during the predetermined time interval may be constant.

For example, when the processor 350 receives an output signal indicating that the change rate of the output voltage Vcref" during a predetermined time interval is greater than the change rate of the voltage Vcref during the same predetermined time interval, the processor 350 may determine that the capacitance of the variable element 330 cannot be synchronized with the capacitance of the reference capacitor 320. Then, the processor 350 may determine a new amplifying ratio of the amplifier 340 in order to synchronize the voltage output of the variable element 330 with the voltage output of the reference capacitor 320. Next, the processor 350 may transmit a signal for the newly determined amplifying ratio to the amplifier 340. In another example, when the processor 350 receives, from the output node 356 of the detection circuit 310, an output signal indicating that the change rate of the output voltage Vcref"

during a predetermined time interval is smaller than the change rate of the voltage Vcref during the same predetermined time interval, the processor 350 may determine that the capacitance of the variable element 330 can be synchronized with the capacitance of the reference capacitor 320 without amplification. Then, the processor 350 may determine a capacitance Cref' of the variable element 330 to allow the output voltage Vcref" of the amplifier 340 to be synchronized with the voltage Vcref applied to both ends of the reference capacitor 320. Next, the processor 350 may transmit a signal for the determined capacitance Cref' to the variable element 330.

In an embodiment, the reference capacitor 320 is a capacitor connected to the first input node 352 of the detection circuit 310 and may be a capacitor having a capacitance value that is fixed or constant (i.e. is not variable in time). For example, the capacitance of the reference capacitor 320 may be equivalent to the capacitance of the capacitors (C1(241) to C5(245)) directly or indirectly connected to the antenna 230 illustrated in FIG. 2.

In an embodiment, the variable element 330 may be connected to the second input node 354 of the detection circuit 310 through the amplifier 340. In an embodiment, the variable element 330 may be a variable capacitor (i.e. capacitance may be variable in time).

In an embodiment, the variable element 330 may be a variable capacitor having a capacitance value which is changeable within a predetermined range. For example, the variable element 330 may have a capacitance value range of 10 nF to 30 nF.

In an embodiment, the variable element 330 may be a cap bank or capacitance array formed by one or more variable elements connected to each other (by series connection and/or parallel connection).

In an embodiment, the capacitance value range of the variable element 330 may depend on the physical structure of the variable element 330. For example, the upper limit of the capacitance value range of the variable element 330 may be depend on the physical or spatial limit of the inside of the sensor module 220. In an embodiment, the upper limit of the capacitance value range of the variable element 330 may be smaller than the capacitance value of the reference capacitor 320.

In an embodiment, the amplifier 340 may be disposed between the variable element 330 and the second input node 354 of the detection circuit 310. For example, the amplifier 340 may be connected in series to the variable element 330 and the second input node 354.

In an embodiment, a voltage Vcref' applied to both ends of the variable element 330 may change (increase or decrease) periodically depending on a voltage Vcref applied to both ends of the reference capacitor 320. In an embodiment, the variation period of the change in voltage Vcref' may be the same as the variation period of the change in voltage Vcref. Although the detailed description will be given as follows, the output voltage Vcref" of the amplifier 340 is the voltage obtained by amplifying the voltage Vcref' at a constant ratio. Therefore, the variation period of the output voltage Vcref" of the amplifier 340 may be also the same as the variation period of the voltage Vcref.

Figure 3B:
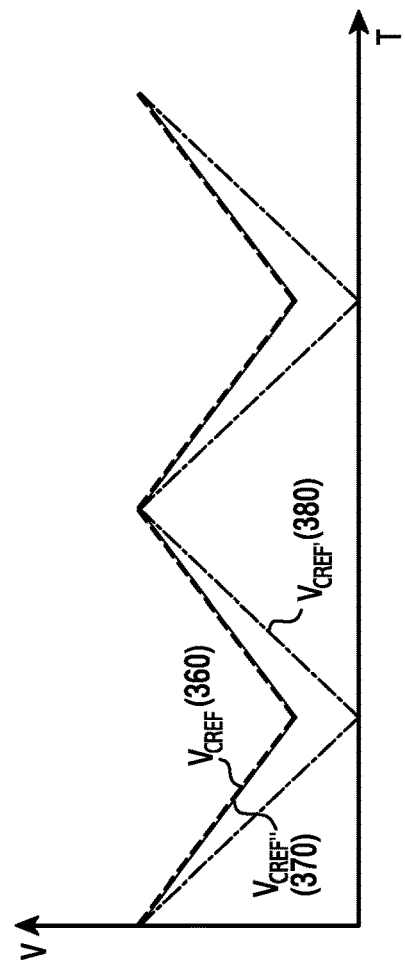
FIG. 3B is a graph illustrating changes of various voltage according to an embodiment of the present disclosure.

In an embodiment, the change rate of the voltage Vcref' of the variable element 330 during a predetermined time interval, or a ratio (e.g. the slope of Vcref' in FIG. 3(b)) of the increasing or decreasing voltage may be determined based on the capacitance of the variable element 330. Also, since the capacitance of the variable element 330 has a capacitance value within a designated range, the change rate of the voltage Vcref' of the variable element 330 during the predetermined time interval may be a value within another designated range.

In an embodiment, in order to detect whether a user body is close, the capacitance of the variable element 330 located inside the sensor module 220 is required to be synchronized with the capacitance of the reference capacitor 320. However, without amplification, in the case where the capacitance value range of the variable element 330 does not include the capacitance value of the reference capacitor 320, the capacitance of the variable element 330 cannot be synchronized with the capacitance of the reference capacitor 320. Therefore, various embodiments of the present disclosure propose a method for synchronizing the voltage output of the variable element 330 with the voltage output of the reference capacitor 320 by amplifying the voltage of the variable element 330 by a predetermined amplifying ratio. This is because the change rate of the voltage of the variable element 330 during a predetermined time interval corresponds to the capacitance value of the variable element 330 and, when the voltage of the variable element 330 is amplified, the change rate of the voltage of the variable element 330 during the predetermined time interval is also changed.

In an embodiment, the amplifier 340 may be an element that amplifies an input voltage of the amplifier 340 by a predetermined amplifying ratio (gain) or an amplifying ratio determined according to an embodiment of the present disclosure, and then outputs the amplified voltage. The amplifier 340 may be controlled by the processor 350.

In an embodiment, an input voltage of the amplifier 340 may be a voltage Vcref' applied to both ends of the variable element 330, and an output voltage of the amplifier 340 may be a voltage Vcref" applied to the second input node 354 of the detection circuit 310. That is, the amplifier 340 may be at least a part of a circuit configured to amplify a voltage Vcref" applied to both ends of the variable element 330 by a designated ratio and then output an amplified voltage to the second input node 354 of the detection circuit 310.

In an embodiment, the amplifier 340 may be at least one inverting OP Amp circuit, at least one non-inverting OP Amp circuit, or a combination thereof.

The detailed description about the amplifier 340 will be given with reference to FIG. 6.

FIG. 3B is a graph illustrating changes of a voltage Vcref (360) applied to both ends of the reference capacitor 320, a voltage Vcref' (380) applied to both ends of the variable element 330, a voltage applied to the second input node of the detection circuit or an output voltage Vcref"(370) of the amplifier, where the x-axis is time.

Referring to FIG. 3B, the voltage Vcref 360 applied to both ends of the reference capacitor 320 may change (e.g. increase or decrease) in time in predetermined time interval (known a as a period). In an embodiment, the reason why the voltage Vcref 360 changes in time may be that the processor 350 is configured to periodically perform the operation of charging or discharging the electric charge stored in the reference capacitor 320. By periodically charging or discharging electric charge stored in the reference capacitor 320, the processor 350 may detect whether the user body is close.

In an embodiment, the increase rate or the decrease rate of the voltage Vcref 360 during the period may be substantially identical to each other.

In an embodiment, the variation period of the voltage Vcref 360 may be determined based on the capacitance of the reference capacitor 320, a resource of the electronic device 100, and/or a recognition time in which the user approaching the electronic device can recognize that a function corresponding to his proximity is performed in the electronic device. In the drawing, only two periods for the change of the voltage Vcref 360 is shown, but the voltage Vcref 360 may continuously or consistently changed when the electronic device is on (e.g. activated or a sleep state).

In an embodiment, the voltage Vcref" 370 applied to the second input node 354 of the detection circuit 310 and the voltage Vcref' 380 applied to both ends of the variable element 330 may change, and variation periods of the voltage Vcref' 370 and the voltage Vcref' 380 may be identical to the variation period of the voltage Vcref 360. Alternatively, the difference in variation periods may be smaller than a predetermined threshold value.

In an embodiment, a ratio in which the voltage Vcref 360 and the voltage Vcref' 380 change (increase or decrease) in time may be dependent on the capacitance Cref of the reference capacitor 320 or the capacitance Cref' of the variable element 330. For example, in consideration of the physical design limits (e.g. limits on the mounting space of a circuit board inside the electronic device) of the variable element 330, it is assumed that the capacitance Cref of the reference capacitor 320 is greater than the capacitance Cref' of the variable element 330. Accordingly, changes in the voltage Vcref 360 applied to both ends of the reference capacitor 320 may be smaller than that of the voltage Vcref' 380 applied to both ends of the variable element 330 during the same time interval. That is, the variable element 330 having a smaller capacitance value has a larger electric charge amount charged or discharged during the same time interval. Therefore, the change rate of the voltage Vcref 360 of the reference capacitor 320 during the predetermined time interval is smaller than (i.e. more gradual than) a change rate of the voltage Vcref' 380 of the variable element 330 during a predetermined time interval.

In an embodiment, the variable element 330 is a variable capacitor designated to have a capacitance value in a predetermined range, and thus the change rate of the voltage Vcref' 380 of the variable element 330 may be within a designated range. In an embodiment, the output voltage Vcref" 370 of the amplifier 340 is a voltage obtained by amplifying the voltage Vcref' 380 by a designated ratio, and thus the change rate of the output voltage Vcref" 370 of the amplifier 340 may also fall within the designated range.

In an embodiment, the voltage Vcref" 370 applied to the second input node 354 of the detection circuit 310 is the output voltage of the amplifier 340, and thus adjusting the amplifying ratio of the amplifier 340 may allow the change rate of the voltage Vcref 360 of the reference capacitor 320 to be included within the designated change rate range of the voltage Vcref" 370, regardless of the physical limit of the variable element 330. Accordingly, the capacitance of the variable element 330 may be configured to allow the voltage Vcref" 370 applied to the second input node 354 to follow or be synchronized with the voltage Vcref 360.

In an embodiment, in the state where the change rate of the voltage Vcref 360 of the reference capacitor 320 during a predetermined time interval is included within a designated change rate range of the voltage Vcref" 370 applied to the second input node 354, the capacitance of the variable element 330 may be determined to allow the voltage Vcref" 370 to follow or be synchronized with the voltage Vcref 360. For example, the capacitance of the variable element 330 may be configured to allow the change rate of the voltage Vcref" 370 to be identical to the change rate of the voltage Vcref 360. Alternatively, the capacitance of the variable element 330 may be configured so that the change rate of the voltage Vcref" 370 is within a predetermined threshold from the change rate of the voltage Vcref 360.

In an embodiment, the capacitance of the variable element 330 may be configured during the manufacture of the electronic device and be stored in the memory of the electronic device. For example, the capacitance of the variable element 330 may be configured during manufacturing before the electronic device 100 is launched as a product.

FIG. 4A is a view illustrating an electronic device according to an embodiment of the present disclosure.

FIG. 4B is a block diagram illustrating a sensor module according to an embodiment of the present disclosure.

FIG. 4C is a graph illustrating changes of various voltages when the proximity of a user body is detected according to an embodiment of the present disclosure.

FIG. 4A shows an example of the electronic device for which a user body has approached. For example, FIG. 4A illustrates the state where the user is holding the electronic device. According to another embodiment, the user body may approach the electronic device when the user wears the electronic device.

In an embodiment, the user may directly hold the part of the metal bezel 110 disposed outside the electronic device. Alternatively, the user may manipulate a separate object different from his or her body (e.g. a holder) so that the object is holding part of the metal bezel 110.

Referring to FIG. 4B, the reference capacitor 320 may be an equivalent capacitor of at least one capacitor (C1(241) to C5(245)) illustrated in FIG. 2, like FIG. 3A.

A proximity-induced capacitor Cprox may be a virtual capacitor virtually formed (or recognized) in a circuit of the sensor module 220 due to the proximity of the user body. This is because when a charged object and a human body contact each other, the human body may store or discharge electric charge, and thus the human body may be regarded as a capacitor.

In an embodiment, a proximity-induced capacitor 420 incurred by the proximity of the user body may be virtually recognized by a circuit of the sensor module 220. For example, when the electronic device approaches the user body, in an equivalent circuit of the detection circuit 310 reflecting the reference capacitor 320, the reference capacitor 320 and the proximity-induced capacitor 420 may be expressed as being connected to each other. This is because the metal bezel 110 disposed outside the electronic device 100 is what approaches the user body, and the reference capacitor 320, again, refers to an equivalent capacitor of at least one capacitor (C1(241) to C5(245)) that is directly/indirectly connected to the metal bezel 110. For example, a proximity-induced capacitor Cprox may be connected in parallel to the reference capacitor Cref.

In an embodiment, a voltage that is input to the first input node 352 of the detection circuit 310 when the user body is close may be different from a voltage that is input to the first input node 352 of the detection circuit 310 when the user body is not close. Specifically, a voltage that is input to the first input node 352 of the detection circuit 310 when the user body is close may be a voltage applied to both ends of an equivalent capacitor of the reference capacitor 320 and the proximity-induced capacitor 420. The capacitance value of the equivalent capacitor of the reference capacitor 320 and the proximity-induced capacitor 420 may be greater than the capacitance of the reference capacitor 320. The capacitance value of the equivalent capacitor may also be greater than the capacitance of the proximity-induced capacitor 420. This is because the reference capacitor 320 and the proximity-induced capacitor 420 are connected in parallel to each other. Therefore, the voltage Vcref+cprox input to the first input node 352 of the detection circuit 310 when the user body is close may have a change rate smaller than that of the voltage Vcref of the first input node 352 of the detection circuit 310 when the user body is not close.

In an embodiment, as illustrated in FIG. 4A, the detection circuit 310 may include two input nodes (the first input node 352 and the second input node 354) and one output node 356, the first input node 352 may be connected to the reference capacitor 320 and the proximity-induced capacitor 420, and the second input node 354 may be connected to the variable element 330 through the amplifier 340.

In an embodiment, the detection circuit 310 may detect a difference between the voltage (indicated by Vcref in case where there is no proximity of user body and indicated by Vcref+cprox in case where there is the proximity of user body) input to the first input node 352 of the detection circuit 310, and a voltage Vcref" input to the second input node, and then may output an output signal indicating the detected difference through the output node 356.

The processor 350 is connected to the output node 356 of the detection circuit 310 and then may receive an output signal of the detection circuit 310. The processor 350 may determine whether a user body is close on the basis of the output signal of the detection circuit 310. In an embodiment, the variable element 330 may be in the state where the capacitance thereof has been synchronized with the capacitance of the reference capacitor 320. Therefore, as illustrated in FIGS. 3B and 4C, a voltage Vcref" input to the second input node 354 of the detection circuit 310 may be synchronized with the voltage Vcref that is input to the first input node when the user body is not close. Then, the output signal of the detection circuit 310 may indicate the difference between the voltage (indicated by Vcref in case where there is no proximity of user body and indicated by Vcref+cprox in case where there is the proximity of user body) input to the first input node 352 and the voltage Vcref" input to the second input node 354. Therefore, the processor 350 may determine whether the user body is close on the basis of the output signal of the detection circuit 310.

For example, when a difference between voltages input to the different input nodes 352 and 354 of the detection circuit 310 is equal to or greater than a predetermined threshold value, the processor 350 may determine that the electronic device 100 is close to the user body. In another embodiment, when the difference between voltages input to the different input nodes 352 and 354 of the detection circuit 310 is smaller than a predetermined threshold value, the processor 350 may determine that the electronic device 100 is not close to the user body.

In an embodiment, the processor 350 may periodically determine whether the user body is close on the basis of the output signal of the detection circuit 310. In an embodiment, the period at which the processor 350 detects whether the user body is close may be the same as the charge/discharge period of capacitors (e.g. the reference capacitor 320 and the variable element 330) of the sensor module 220. Alternatively, the period may be shorter than the charge/discharge period of capacitors of the sensor module 220. For example, the processor 350 may determine whether the user body is close according to a period identical to the voltage variation period of the capacitors, as illustrated in FIG. 4C. In another embodiment, the processor 350 may determine whether the user body is close based on a time point when the voltage applied to both ends of the reference capacitor 320 is a minimum value. This is because when the voltage applied to both ends of the reference capacitor 320 is a minimum value, the difference 440 between voltages input to different input nodes 352 and 354 of the detection circuit 310 is the greatest, and thus at this point, the detection of whether the user body is close may be done more easily.

In an embodiment, the processor may determine different threshold values for detecting whether the user body is close depending on when the processor detects whether the user body is close. For example, when whether the user body is close is detected at every time when the voltage applied to both ends of the reference capacitor 320 is the minimum value, the processor 350 may configure the threshold value for detecting whether the user body is close to be relatively high. In another example, whether the user body is close is detected at another time, the processor 350 may configure the threshold value to be relatively low. This is because when the voltage applied to both ends of the reference capacitor 320 is the minimum value, the difference 440 between voltages input to different input nodes 352 and 354 of the detection circuit 310 is the greatest.

Other aspects FIGS. 4B-4C are the same or similar to those of FIGS. 3A and 3B, and thus the explanation thereof will be omitted.

Figure 5:
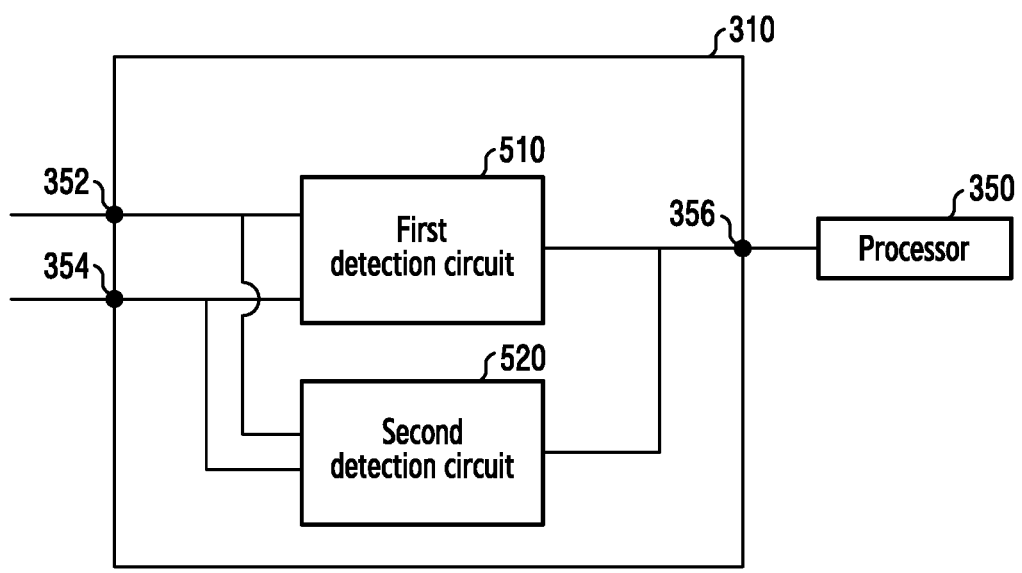
FIG. 5 is a block diagram illustrating a detection circuit included in a sensor module according to an embodiment of the present disclosure.

FIG. 5 is a block diagram illustrating a detection circuit included in a sensor module according to an embodiment of the present disclosure.

Referring to FIG. 5, the detection circuit 310 may include a first detection circuit 510 and a second detection circuit 520. According to an embodiment, the first detection circuit 510 and the second detection circuit 520 may share two input nodes and one output node in common, the two input nodes may be the input nodes 352 and 354 of the detection circuit 310, and the one output node may be the output node 356.

In an embodiment, the first detection circuit 510 may be at least a part of a circuit that configures the voltage output of the variable element 330 located in the sensor module 220 to be synchronized with the voltage output of the reference capacitor 320. For example, the first detection circuit 510 may be at least a part of a circuit that configures the voltage Vcref" applied to the second input node 354 of the detection circuit 310 to follow or be synchronized with a voltage Vcref input to the first input node 352 of the detection circuit 310.

In an embodiment, the first detection circuit 510 may be activated in the state where the voltage output of the variable element 330 located in the sensor module 220 has not been synchronized with the voltage output of the reference capacitor 320. For example, the first detection circuit 510 may be activated in the state where a voltage Vcref" applied to the second input node 354 of the detection circuit 310 has not been synchronized with a voltage Vcref input to the first input node 352 of the detection circuit 310.

In an embodiment, the first detection circuit 510 and the second detection circuit 520 may be selectively activated. In other words, in an embodiment, when the first detection circuit 510 is activated, the second detection circuit 520 may be inactivated, and when the second detection circuit 520 is activated, the first detection circuit 510 may be inactivated. This is because the first detection circuit 510 is a circuit that configures the voltage output of the variable element 330 located in the sensor module 220 to be synchronized with the voltage output of the reference capacitor 320, and the second detection circuit 520 is a circuit that detects whether the user body is close, when the voltage output of the variable element 330 located in the sensor module 220 has been synchronized with the voltage output of the reference capacitor 320.

In an embodiment, the first detection circuit 510 may include a circuit that detects change rates of the voltage Vcref input to the first input node 352 of the detection circuit 310 and the voltage Vcref" applied to the second input node 354 during a predetermined time interval. The first detection circuit 510 may then output, through the output node 356, an output signal indicating whether the change rate of the voltage Vcref" of the second input node 354 during a predetermined time interval is equal to or greater than the change rate of the voltage Vcref of the first input node 352 during the predetermined time interval.

In an embodiment, the second detection circuit 520 may include at least a part of a circuit that detects the difference between the voltages applied to the two different input nodes 352 and 354 of the detection circuit 310 in the state where the voltage output of the variable element 330 has been synchronized with the voltage output of the reference capacitor 320. This difference may be used to determine whether the user body is close. In an embodiment, the voltage Vcref" applied to the second input node 354 of the detection circuit 310 may be the output voltage of the amplifier 340, the voltage applied to the first input node 352 of the detection circuit 310 may be the voltage Vcref applied to both ends of the reference capacitor 320 when there is no proximity of the user body or the voltage Vcref+cprox applied to both ends of an equivalent capacitor of the reference capacitor 320 and the proximity-induced capacitor 420 when there is proximity of the user body.

In an embodiment, the voltage output of the variable element 330 is synchronized with the voltage output of the reference capacitor 320. Therefore, the voltage Vcref" applied to the second input node 354 of the detection circuit 310 may be synchronized with the voltage Vcref applied to both ends of the reference capacitor 320. Accordingly, when there is no proximity of the user body, the second detection circuit 520 may determine no difference between voltages input to the different input nodes 352 and 354. In another embodiment, when there is proximity of the user body, the second detection circuit 520 may determine a value other than 0 as the difference between voltages input to the different input nodes 352 and 354.

In an embodiment, the second detection circuit 520 may output an output signal indicating the detected difference value through the output node 356.

In an embodiment, the second detection circuit 520 may be activated in the state where the voltage output of the variable element 330 has been synchronized with the voltage output of the reference capacitor 320. For example, the second detection circuit 520 may be activated when the capacitance of the variable element 330 is synchronized with the capacitance of the reference capacitor 320.

In an embodiment, the processor 350 may perform a particular operation based on the output signal output from the first detection circuit 510 or the second detection circuit 520 or may transmit, to another element of the electronic device 100, a signal allowing the another element to perform the particular operation.

In an embodiment, the processor 350 may receive, from the first detection circuit 510 through the output node 356, a signal indicating whether the change rate of the voltage Vcref" of the second input node 354 during a predetermined time interval is equal to or greater than the change rate of the voltage Vcref of the first input node 352 during the predetermined time interval.

In an embodiment, when the signal indicates that the change rate of the voltage Vcref" is equal to or greater than the change rate of the voltage Vcref, the processor 350 may determine that the voltage output of the variable element 330 cannot be synchronized with the voltage output of the reference capacitor 320 unless the processor 350 changes the amplifying ratio of the amplifier 340. The processor 350 may then determine a new amplifying ratio of the amplifier 340.

In an embodiment, the processor 350 may change the amplifying ratio of the amplifier 340 to be a ratio or a value changed by a proportion determined on the basis of the current amplifying ratio. For example, when the current amplifying ratio is 2 (i.e. gain of 2), the processor 350 may change the amplifying ratio to 2.2 by multiplying the current amplifying ratio by a pre-configured proportion (e.g. increase of 10%).

In an embodiment, the processor 350 may repeatedly change the amplifying ratio of the amplifier 340 until the change rate of the output voltage Vcref" becomes equal to or smaller than the change rate of the voltage Vcref.

In an embodiment, the processor 350 may determine the amplifying ratio of the amplifier 340 based on a representative value of the designated capacitance range of the variable element 330, and the detailed description will be given with reference to FIG. 8.

In an embodiment, when the signal indicates that the change rate of the voltage Vcref" is equal to or smaller than the change rate of the voltage Vcref, the processor 350 may determine that the voltage output of the variable element 330 can be synchronized with the voltage output of the reference capacitor 320. For example, the processor 350 may determine that the voltage output of the variable element 330 can be synchronized with the voltage output of the reference capacitor 320 when the processor maintains the current amplifying ratio of the amplifier 340. The processor 350 may determine the capacitance of the variable element 330 within the designated capacitance range to be synchronized with the capacitance of the reference capacitor 320. For example, the processor 350 may determine the capacitance of the variable element 330, which is within the designated capacitance range of the variable element 330, to allow the output voltage Vcref" of the amplifier 340 to be synchronized with the voltage Vcref applied to both ends of the reference capacitor 320.

In an embodiment, the processor 350 may receive, from the second detection circuit 520, an output signal indicating a difference between two input voltages of the detection circuit 310 and then detect whether the user body is close based on the received output signal.

In an embodiment, two input voltages of the detection circuit 310 may be voltages indicated by reference Vcref" and Vcref+cprox when the electronic device 100 is close to a user body, and may be voltages indicated by reference Vcref" and Vcref when the electronic device 100 is not close to a user body.

In an embodiment, the processor 350 may determine whether the difference between two input voltages of the detection circuit 310 is equal to or greater than a pre-configured threshold value and, when the difference is equal to or greater than the pre-configured threshold value, may determine that the electronic device 100 is close to the user body. In another embodiment, when the difference value therebetween is smaller than the pre-configured threshold value, the processor 350 may determine that the electronic device 100 is not close to the user body.

Figure 6:
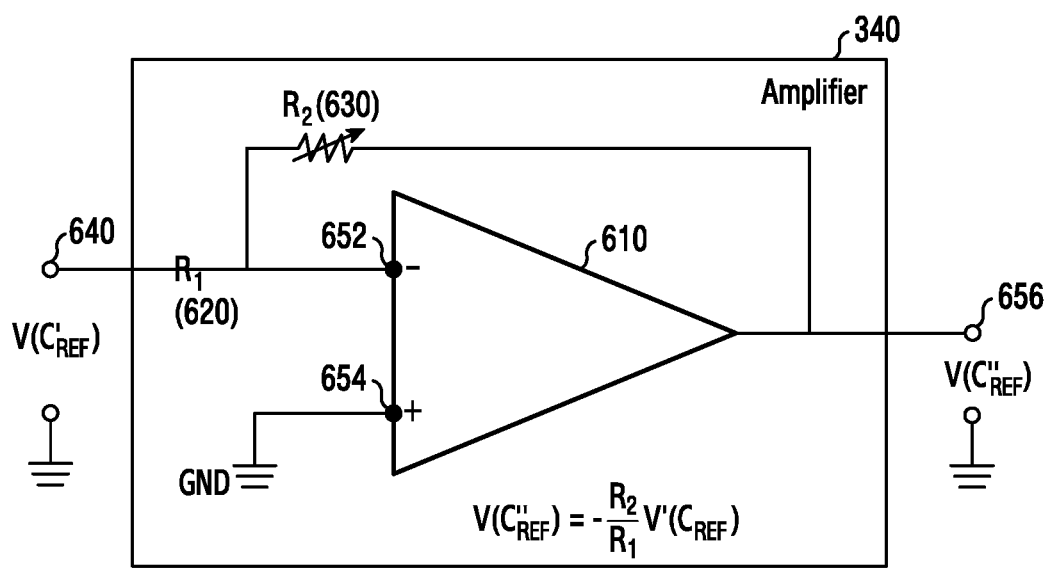
FIG. 6 is a block diagram illustrating an amplifier included in a sensor module according to an embodiment of the present disclosure.

FIG. 6 is a block diagram illustrating an amplifier included in the sensor module according to an embodiment of the present disclosure.

Referring to FIG. 6, the amplifier 340 may include an op amp circuit having two input nodes 652 and 654 and one output node 656. In an embodiment, the amplifier 340 may be an inverting amplifier op amp circuit.

In an embodiment, the two input nodes 652 and 654 of an op amp included in the amplifier may include the non-inverting node 654 and the inverting node 652. In an embodiment, the non-inverting node 654 is grounded, and an input voltage may be applied to the inverting node 652.

In an embodiment, an input voltage of the amplifier 340, which is applied to the inverting node 652 of the amplifier, may be the voltage Vcref' applied to both ends of the variable element 330, and the output voltage of the amplifier 340, which is output to the output node 656 of the amplifier 340, may be the voltage Vcref" applied to the second input node 354 of the detection circuit 310.

In an embodiment, the inverting node 652 of the amplifier may be connected to at least two passive elements (R1 620 and R2 630). In the drawing, only an R2 630 is illustrated as a variable resistor, but either R1 620 and/or R2 630 may be a variable resistor. For example, at least one of R1 620 and R2 630 may be a variable resistor having a resistance value changeable within a designated range by the control of the processor 350. In an embodiment, the R1 620 may be located between the inverting node 652 and the variable element 330, and the R2 630 may be located between R1 620 and the output node 650 of the amplifier 340.

In an embodiment, in accordance with the virtual short and virtual open principle of an op amp, the output voltage Vcref" of the amplifier 340 may be a voltage obtained by amplifying the voltage Vcref" applied to both ends of the variable element 330 by a ratio determined on the basis of the values of at least two passive elements (R1 620 and R2 630). In an embodiment, the ratio determined on the basis of the values of at least two passive elements (R1 620 and R2 630) may be a value obtained by dividing R2 by R1. For example, when R2=2*R1, a ratio is determined as 2 (i.e. gain of 2). Therefore, the output voltage Vcref" of the amplifier 340 may be determined to be two times the voltage Vcref' applied to both ends of the variable element 330.

In an embodiment, the amplifying ratio of the amplifier 340 may be changed by the control of the processor 350. This is because the amplifying ratio of the amplifier 340 is determined on the basis of the values of at least two passive elements (R1 620 and R2 630), and at least one among the two passive elements (R1 620 and R2 630) is a variable resistor, the value of which may be changed by the control of the processor 350.

In an embodiment, when the change rate of the output voltage Vcref" of the amplifier during a predetermined time interval is equal to or greater than the change rate of the voltage Vcref of the first input node 352 of the detection circuit 310 during the predetermined time interval, the amplifying ratio of the amplifier 340 may be changed by the control of the processor 350.

In an embodiment, the amplifying ratio of the amplifier 340 may be repeatedly changed by the control of the processor 350 until the change rate of the output voltage Vcref" becomes equal to or smaller than the change rate of the voltage Vcref. Accordingly, the amplifying ratio of the amplifier 340 may be configured to allow the change rate of the output voltage Vcref" to be equal to or smaller than a change rate of the voltage Vcref.

An electronic device according to an embodiment of the present disclosure may include: an antenna configured to be at least a part of an exterior of the electronic device; a variable element that has a capacitance in a designated range; and an amplifier connected to the variable element and configured to amplify a voltage of the variable element by a designated ratio and output an amplified voltage, wherein the capacitance of the variable element and the designated ratio may be configured so that a difference between a voltage of the antenna and an output voltage of the amplifier is smaller than a designated threshold value.

According to an embodiment, the voltage of the antenna may be a voltage of a reference capacitor serving as an equivalent circuit for the antenna, the reference capacitor having a capacitance corresponding to at least one capacitor connected to the antenna.

According to an embodiment, the electronic device may further include a detection circuit, the detection circuit may include a first input port connected to the antenna and a second input port connected to the amplifier, and the detection circuit may be configured to identify at least two input voltages input to the first input port and the second input port and a difference between the at least two input voltages, and output an output signal indicating the difference between the at least two input voltages.

According to an embodiment, one of the at least two input voltages may be the amplified voltage of the amplifier, the other one of the at least two input voltages may be the voltage of the reference capacitor when the electronic device is not close to a user body or a voltage of an equivalent capacitor of the reference capacitor and a capacitor virtually formed by proximity of the user body, when the electronic device is close to the user body.

According to an embodiment, the electronic device may further include a processor, the processor may be configured to obtain the output signal from the detection circuit and, when the difference between the at least two input voltages included in the output signal satisfies a designated condition, output a signal corresponding to proximity of a user body to the electronic device.

According to an embodiment, the designated condition may be a condition wherein the difference between the at least two input voltages is equal to or greater than a pre-configured threshold value.

According to an embodiment, the pre-configured threshold value may be configured based on a capacitance value of the reference capacitor.

According to an embodiment, the processor may be further configured to, when a change rate of the amplified voltage of the amplifier during a predetermined time interval is greater than a change rate of the voltage of the reference capacitor during the predetermined time interval, change the designated ratio so that the amplifier amplifies the voltage of the variable element by the changed designated ratio.

According to an embodiment, the amplifier may be further configured to, until the change rate of the amplified voltage of the amplifier during the predetermined time interval is smaller than the change rate of the voltage of the reference capacitor during the predetermined time interval, repeatedly change the designated ratio.

According to an embodiment, the processor may be further configured to, when the change rate of the amplified voltage of the amplifier during the predetermined time interval is smaller than the change rate of the voltage of the reference capacitor during the predetermined time interval, change the capacitance of the variable element within the designated range so that the difference between the voltage of the reference capacitor and the amplified voltage of the amplifier is smaller than the designated threshold value.

According to an embodiment, the changed designated ratio may be determined based on at least one of a representative value of the designated range of the variable element and the capacitance value of the reference capacitor.

According to an embodiment, the designated ratio may be a ratio by which the amplified voltage of the amplifier is synchronized with the voltage of the reference capacitor when the capacitance of the variable element is determined to be the representative value.

According to an embodiment, respective voltages of the reference capacitor and the variable element may be configured to periodically change.

According to an embodiment, the detection circuit may periodically identify the at least two input voltages and the difference between the at least two input voltages, and a period of the identification may be the same as a variation period of the reference capacitor and the variable element or may be a period shorter than the variation period.

An electronic device according to an embodiment of the present disclosure may include: an antenna; a variable element that has a capacitance in a designated range; and an amplifier connected to the variable element and configured to amplify a voltage of the variable element by a designated ratio and output an amplified voltage, wherein the capacitance of the variable element and the designated ratio may be configured so that a difference between a voltage of the antenna and the amplified voltage of the amplifier is smaller than a designated threshold value.

According to an embodiment, the electronic device may further include a detection circuit, and the detection circuit may include a first input port connected to the antenna and a second input port connected to the amplifier, and the detection circuit may be configured to identify at least two input voltages input to the first input port and the second input port and a difference between the at least two input voltages, and output an output signal indicating the difference.

According to an embodiment, the voltage of the antenna may be a voltage of a reference capacitor serving as an equivalent circuit for the antenna, the reference capacitor having a capacitance corresponding to at least one capacitor connected to the antenna, one of the at least two input voltages may be the output voltage of the amplifier, and the other one of the at least two input voltages may be the voltage of the reference capacitor when the electronic device is not close to a user body or a voltage of an equivalent capacitor of the reference capacitor and a capacitor virtually formed by proximity of the user body, when the electronic device is close to the user body.

Figure 7:
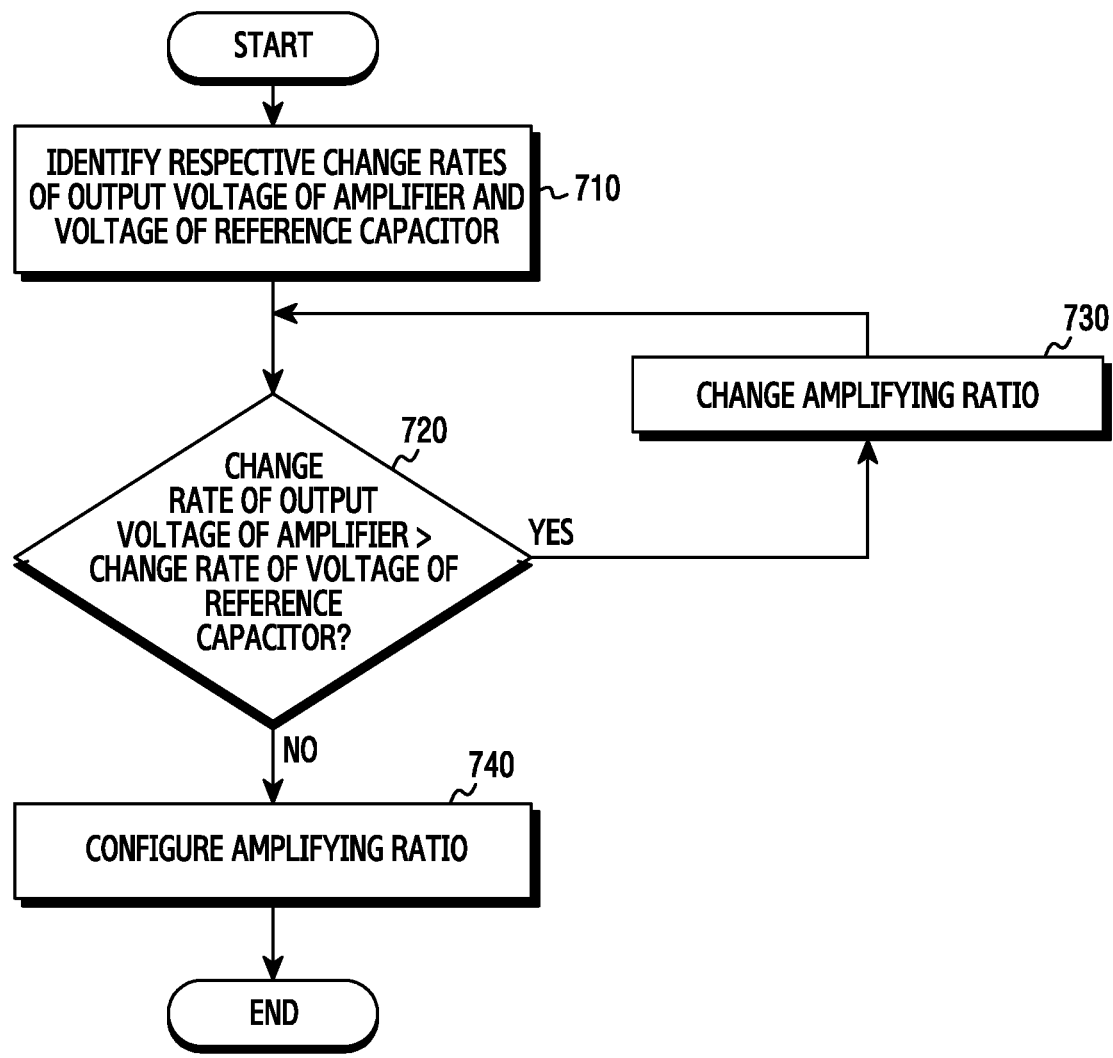
FIG. 7 is a flowchart of an electronic device for configuring an amplifying ratio according to an embodiment of the present disclosure.

FIG. 7 is a flowchart of the electronic device for configuring an amplifying ratio of the amplifier according to an embodiment of the present disclosure.

In operation 710, the processor 350 may identify respective change rates of the output voltage Vcref" of the amplifier 340 and the voltage Vcref of the reference capacitor 320 during a predetermined time interval. In an embodiment, the processor 350 may identify the respective change rates in order to determine whether the voltage output of the variable element 330 can be synchronized with the voltage output of the reference capacitor 320. In an embodiment, operation 710 may be performed in the state where the output voltage Vcref" of the amplifier 340 does not follow or has not been synchronized with the voltage Vcref applied to both ends of the reference capacitor 320.

In an embodiment, the processor 350 may identify the respective change rates by identifying the values of voltages at two different time points included in a charge interval (or included in a discharge interval).

In an embodiment, the processor 350 may determine the absolute values of the identified change rates. For example, when the identified change rates corresponds to negative values (i.e. the change rates is determined in the discharge interval), the processor 350 may determine the absolute values of the identified change rates.

In operation 720, the processor 350 may determine whether the identified change rate of the output voltage Vcref" of the amplifier 340 during the predetermined time interval is greater than the identified change rate of the voltage Vcref of the reference capacitor 320 during the predetermined time interval. In an embodiment, when the difference is equal to or greater than a pre-configured value, the processor 350 may determine that the change rate of the output voltage Vcref" is greater than the change rate of the output voltage Vcref.

When it is determined that the identified change rate of the output voltage Vcref" is greater than the identified change rate of the voltage Vcref, the processor 350 may change an amplifying ratio in operation 730.

In an embodiment, the amplifying ratio may mean the amplifying ratio of the amplifier 340, i.e. the ratio of R2 630 and R1 620. Therefore, the processor may change the amplifying ratio of the amplifier 340 by changing at least one value among R2 630 and R1 620.

In an embodiment, the processor 350 may change the amplifying ratio of the amplifier 340 to allow the lower limit of a designated change rate range of the output voltage Vcref" to become smaller than the change rate of the voltage Vcref. For example, the processor 350 may change the amplifying ratio of the amplifier 340 to allow the lower limit of the designated change rate range of the output voltage Vcref" to become smaller than the change rate of the voltage Vcref by a predetermined proportion (e.g. 0.8 times).

In an embodiment, the processor 350 may repeatedly change the amplifying ratio of the amplifier 340 until the change rate of the output voltage Vcref" equal to or smaller than a change rate of the voltage Vcref. In an embodiment, the processor 350 may change the amplifying ratio of the amplifier 340 to be a value changed by a proportion. For example, when the current amplifying ratio is 2, the processor 350 may change the amplifying ratio to 2.2 times by multiplying the current amplifying ratio by a pre-configured proportion (e.g. increase of 10%).

When it is determined that the identified change rate of the output voltage Vcref" is equal to or smaller than the identified change rate of the voltage Vcref, the processor 350 may configure the amplifying ratio in operation 740. That is, the processor 350 may configure the current amplifying ratio as the amplifying ratio of the amplifier 340. In an embodiment, the processor 350 may store the configured amplifying ratio of the amplifier 340 in the memory.

In an embodiment, the operation of configuring the amplifying ratio of the amplifier 340 may be an operation of configuring the amplifying ratio to allow the change rate of the voltage Vcref applied to both ends of the reference capacitor 320 during a predetermined time interval to be included within a change rate range of the output voltage Vcref" of the amplifier 340 during the predetermined time interval.

In an embodiment, when the amplifying ratio is not changed, the processor 350 may configure a default value as the amplifying ratio. In an embodiment, the default value may be an amplifying ratio based on R1 620 and R2 630 determined before the operations of FIG. 7 are performed.

In an embodiment, when the amplifying ratio is changed at least once, the processor 350 may configure a previously changed value as the amplifying ratio. For example, when the amplifying ratio is initially 2 and then changed to 2.2, the processor 350 may configure, as the amplifying ratio, 2.2 which is the previously changed value.

Although the following description is not illustrated, the processor 350 may configure the amplifying ratio in operation 740, and then may configure the capacitance Cref' of the variable element 330 to allow the output voltage Vcref" of the amplifier 340 to follow or be synchronized with the voltage Vcref applied to both ends of the reference capacitor 320.

In an embodiment, the operation, illustrated in FIG. 7, for configuring the amplifying ratio of the amplifier 340 may be performed before the voltage output of the variable element 330 is configured to be synchronized with the voltage output of the reference capacitor 320.

Figure 8:
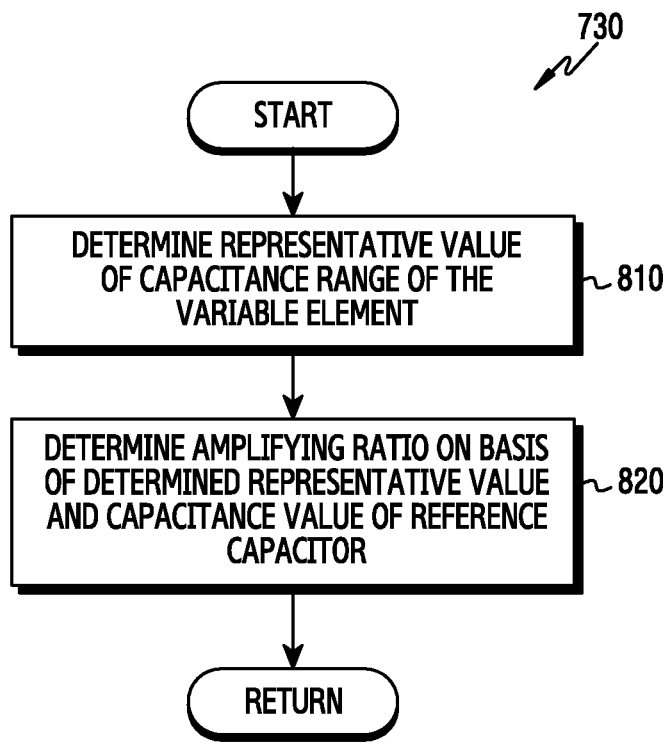
FIG. 8 is a flowchart of an operation for changing an amplifying ratio according to an embodiment of the present disclosure.

FIG. 8 is a flowchart of an operation for changing the amplifying ratio according to an embodiment of the present disclosure. FIG. 8 is a specific flowchart of the operation 730 of FIG. 7 of changing the amplifying ratio by the processor.

The processor 350 may determine a representative value of the capacitance value range of the variable element 330 in operation 810. In an embodiment, the representative value of the capacitance value range may be a value included in the capacitance value range. In an embodiment, the representative value of the capacitance value range may be a value obtained by dividing the upper limit and lower limit of the capacitance value range of the variable element 330 by a predetermined ratio. For example, when the predetermined ratio is 1:1, the representative value of the capacitance value range may be the average value of the upper limit and the lower limit.

The processor 350 may determine the amplifying ratio on the basis of the capacitance Cref of the reference capacitor 320 and the determined representative value, in operation 820.

In an embodiment, when the determined representative value is determined as the capacitance of the variable element 330, the processor 350 may determine the amplifying ratio such that, when the voltage Vcref' applied to both ends of the variable element 330 is amplified, the amplified voltage Vcref' follows the voltage Vcref applied to both ends of the reference capacitor 320. For example, assume that the capacitance value range of the variable element 330 is 10 to 20 nF, the current capacitance value of the variable element 330 is 12 nF, the capacitance of the reference capacitor 320 is 30 nF, and the representative value of the range is determined to be 15 nF. The processor 350 may configure the amplifying ratio to be 2 to allow the output voltage Vcref" of the amplifier 340 after amplification to follow the voltage Vcref applied to both ends of the reference capacitor 320.

Although the following description is not illustrated, the processor 350 may determine the amplifying ratio such that, the processor 350 amplifies the voltage Vcref' applied to both ends of the variable element 330 while maintaining the current capacitance of the variable element 330 as it is. In this case, the amplified voltage Vcref" follows the voltage Vcref applied to both ends of the reference capacitor 320.

Figure 9:
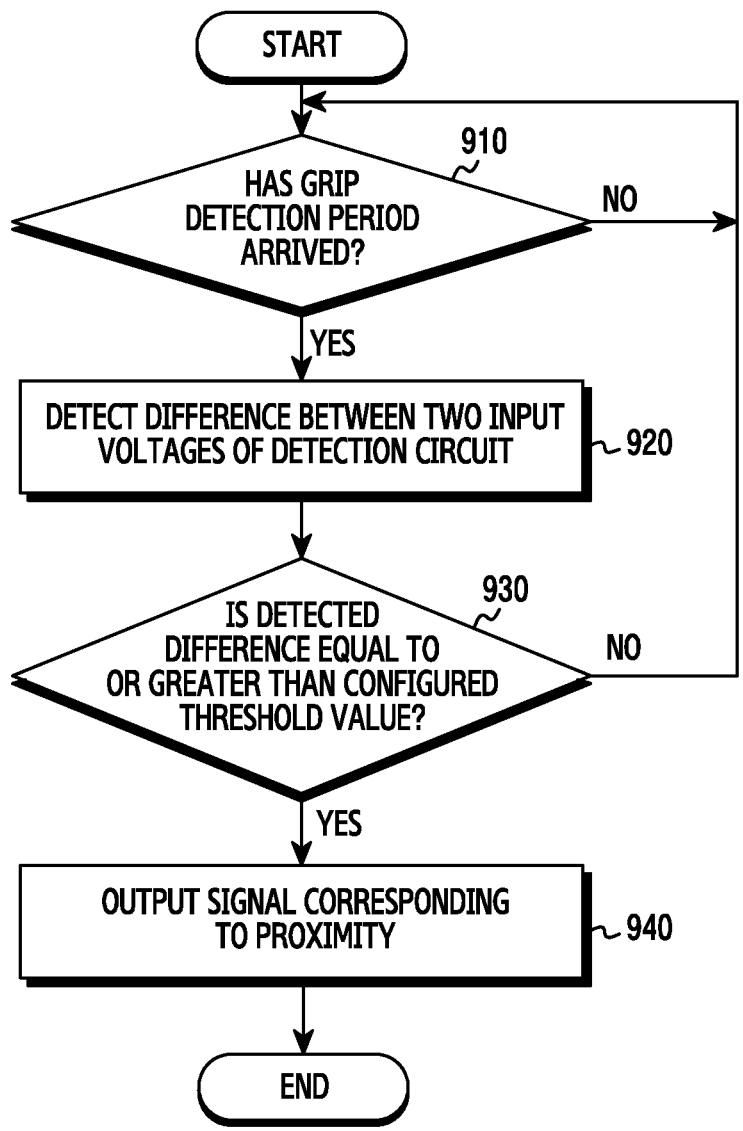
FIG. 9 is a flowchart of an electronic device configured to detect proximity of a user body according to an embodiment of the present disclosure.

FIG. 9 is a flowchart of the electronic device configured to detect the proximity of a user body according to an embodiment of the present disclosure.

The processor 350 may identify whether a detection period for the proximity of a user body has arrived, in operation 910. In an embodiment, the processor 350 may perform operation 910 based on a charge/discharge period of the variable element 330 or the reference capacitor 320. For example, the detection period for the proximity of the user body may be identical to the charge or discharge period of capacitors (e.g. the reference capacitor 320 and the variable element 330) of the sensor module 220. Therefore, when the charge period of the reference capacitor 320 has arrived, the processor 350 may identify that the detection period for the proximity of the user body has also arrived. For example, the processor 350 may detect whether the user body is close at every time point when the reference capacitor 320 and/or the variable element 330 is fully discharged. The reason for choosing this point in the charge period is because when the electronic device 100 is close to the user body, the difference between the voltages Vcref" and Vcref+cprox input to the two input nodes 352 and 354 of the detection circuit 310 is greatest when the capacitors are fully discharged.

The processor 350 may detect the difference between the two input voltages of the detection circuit 310, in operation 920. In an embodiment, the two input voltages of the detection circuit 310 may be voltages indicated by reference signs Vcref" and Vcref+cprox when the electronic device 100 is close to the user body, and may be voltages indicated by reference signs Vcref" and Vcref when the electronic device 100 is not close to the user body.

The processor 350 may identify whether the detected difference value is equal to or greater than the pre-configured threshold value, in operation 930.

In an embodiment, the pre-configured threshold value may be different depending on the capacitance Cref of the reference capacitor 320. For example, when the capacitance Cref of the reference capacitor 320 is a relatively large value, the slope of the voltage Vcref applied to both ends of the reference capacitor 320 is relatively gradual. Therefore, when the electronic device 100 is close to the user body, the difference between the two input voltages of the detection circuit 310 when the capacitors are fully discharged may be relatively small. Therefore, the threshold value for detecting the proximity of the user body may be configured to be relatively low. In another example, when the capacitance Cref of the reference capacitor 320 is a relatively small value, the slope of the voltage Vcref applied to both ends of the reference capacitor 320 is relatively steep. Therefore, when the electronic device 100 is close to the user body, the difference between the two input voltages of the detection circuit 310 when the capacitors are fully discharged may be relatively large. Therefore, the threshold value for detecting the proximity of the user body may be configured to be relatively high.

When it is determined that the detected difference is equal to or greater than the pre-configured threshold value, the processor 350 may output a signal corresponding to the proximity of the user body, in operation 940.

In an embodiment, when it is determined the detected difference is equal to or greater than the pre-configured threshold value, the processor 350 may determine that the electronic device 100 is close to the user body and transmit a signal corresponding to the proximity to another element included in the electronic device.

The operations according to FIG. 9 may be performed in the state where the voltage output of the variable element 330 has been synchronized with the voltage output the reference capacitor 320. That is, the operations according to FIG. 9 may be performed in the state where the output voltage Vcref" of the amplifier follows or has been synchronized with the voltage Vcref applied to both ends of the reference capacitor.

An operation method of an electronic device configured to detect proximity of a user according to an embodiment of the present disclosure may include: identifying a change rate during a predetermined time interval of an output voltage of an amplifier configured to amplify, by a designated ratio, a voltage of a variable element that has a capacitance in a designated range; identifying a change rate during a predetermined time interval of a voltage of a reference capacitor serving as an equivalent circuit for an antenna; determining whether the identified change rate of the output voltage of the amplifier during the predetermined time interval is greater than the change rate of the voltage of the reference capacitor during the predetermined time interval; and changing the designated ratio of the amplifier in response to determining that the identified change rate of the output voltage of the amplifier during the predetermined time interval is greater than the change rate of the voltage of the reference capacitor during the predetermined time interval.

According to an embodiment, the changing of the designated ratio of the amplifier may include: repeatedly changing the designated ratio of the amplifier until the identified change rate of the output voltage of the amplifier during the predetermined time interval is smaller than the change rate of the voltage of the reference capacitor during the predetermined time interval.

According to an embodiment, the operation method may further include: when the change rate of the output voltage of the amplifier during the predetermined time interval is smaller than the change rate of the voltage of the reference capacitor during the predetermined time interval, changing the capacitance of the variable element within the designated range so that a difference between the voltage of the reference capacitor and the output voltage of the amplifier is smaller than a designated threshold value.

According to an embodiment, the designated ratio may be changed based on at least one of a representative value of the designated range of the variable element and the capacitance value of the reference capacitor.

According to an embodiment, when the capacitance of the variable element is determined to be the representative value, the changed designated ratio may be a ratio by which the output voltage of the amplifier is synchronized with the voltage of the reference capacitor.

According to an embodiment, the operation method may further include: identifying, when the difference between the voltage of the reference capacitor and the output voltage of the amplifier is smaller than the designated threshold value, the output voltage of the amplifier, the voltage of the reference capacitor, and the difference between the voltages; and outputting, when the identified difference between the voltages satisfies a designated condition, a signal corresponding to the proximity of the user body to the electronic device, wherein, when the electronic device is close to the user body, the voltage of the reference capacitor may be a voltage of an equivalent capacitor of the reference capacitor and a capacitor virtually formed by the proximity of the user body, when the electronic device is close to the user body.

The memory described above may be a computer-readable storage medium. The computer-readable storage medium may include a hard disk, a floppy disk, a magnetic medium (e.g. a magnetic tape), an optical recording media (e.g. CD-ROM, DVD), a Magneto-Optical Media (e.g., a floptical disk), an inner memory, etc. Instructions stored on the computer-readable storage medium may include code made by a complier or code executable by an interpreter. The module or programming module according to the various embodiments may include one or more of the aforementioned elements or may further include other additional elements, or some of the aforementioned elements may be omitted. Operations performed by a module, a programming module, or other elements according to various embodiments may be executed sequentially, in parallel, repeatedly, or in a heuristic manner. At least some operations may be executed according to another sequence, may be omitted, or may further include other operations.

The embodiments disclosed in the present specifications and drawings are provided merely to readily describe and to help a thorough understanding of the present disclosure but are not intended to limit the scope of the present disclosure. Therefore, it should be construed that, in addition to the embodiments disclosed herein, all modifications or changed forms derived from the technical idea of the present disclosure fall within the scope of the present disclosure.

According to various embodiments, the electronic device may amplify the voltage of a variable capacitor in order to allow the variable capacitor, which has a capacitance of a limited range, to cover capacitance beyond the limited range, in order to determine whether a user body is close.

Certain aspects of the above-described embodiments of the present disclosure can be implemented in hardware, firmware or via the execution of software or computer code that can be stored in a recording medium such as a CD ROM, a Digital Versatile Disc (DVD), a magnetic tape, a RAM, a floppy disk, a hard disk, or a magneto-optical disk or computer code downloaded over a network originally stored on a remote recording medium or a non-transitory machine readable medium and to be stored on a local recording medium, so that the methods described herein can be rendered via such software that is stored on the recording medium using a general purpose computer, or a special processor or in programmable or dedicated hardware, such as an ASIC or FPGA. As would be understood in the art, the computer, the processor, microprocessor controller or the programmable hardware include memory components, e.g., RAM, ROM, Flash, etc. that may store or receive software or computer code that when accessed and executed by the computer, processor or hardware implement the processing methods described herein.

What is claimed is:

1. An electronic device for detecting proximity of a user comprising:
    an antenna configured to be at least a part of an exterior of the electronic device, wherein a voltage of the antenna is a voltage of a reference capacitor serving as an equivalent circuit for the antenna, the reference capacitor having a capacitance corresponding to at least one capacitor connected to the antenna;
    a variable element configured to have a capacitance in a designated range, wherein an upper limit of the designated range is smaller than the capacitance of the reference capacitor; and
    an amplifier connected to the variable element and configured to amplify a voltage of the variable element to a voltage of the reference capacitor and output the amplified voltage,
    wherein the capacitance of the reference capacitor corresponds to a first change rate of the voltage of the reference capacitor during a designated time interval.

2. The electronic device of claim 1, further comprising a detection circuit including a first input port connected to the antenna and a second input port connected to the amplifier, wherein the detection circuit is configured to:
    identify at least two input voltages input to the first input port and the second input port and a difference between the at least two input voltages; and output an output signal indicating the difference between the at least two input voltages.

3. The electronic device of claim 2, wherein one of the at least two input voltages is the amplified voltage of the amplifier, and an other one of the at least two input voltages is the voltage of the reference capacitor when the electronic device is not close to a user body or a voltage of an equivalent capacitor of the reference capacitor and a capacitor virtually formed by proximity of the user body, when the electronic device is close to the user body.

4. The electronic device of claim 3, further comprising a processor, wherein the processor is configured to:

obtain the output signal from the detection circuit, and
when the difference between the at least two input voltages included in the output signal satisfies a designated condition, output a signal corresponding to the proximity of the user body to the electronic device.

5. The electronic device of claim 4, wherein the designated condition is a condition wherein the difference between the at least two input voltages is equal to or greater than a pre-configured threshold value.

6. The electronic device of claim 5, wherein the pre-configured threshold value is configured based on the capacitance of the reference capacitor.

7. The electronic device of claim 4, wherein the processor is further configured to, when a second change rate of the amplified voltage of the amplifier during a predetermined time interval is greater than a third change rate of the voltage of the reference capacitor during the predetermined time interval, change a designated ratio so that the amplifier amplifies the voltage of the variable element by the changed designated ratio.

8. The electronic device of claim 7, wherein the amplifier is further configured to, until the second change rate of the amplified voltage of the amplifier during the predetermined time interval is smaller than the third change rate of the voltage of the reference capacitor during the predetermined time interval, repeatedly change the designated ratio.

9. The electronic device of claim 8, wherein the processor is further configured to, when the second change rate of the amplified voltage of the amplifier during the predetermined time interval is smaller than the third change rate of the voltage of the reference capacitor during the predetermined time interval, change the capacitance of the variable element within the designated range so that the difference between the voltage of the reference capacitor and the amplified voltage of the amplifier is smaller than a designated threshold value.

10. The electronic device of claim 7, wherein the changed designated ratio is determined based on at least one of a representative value of the designated range of the variable element and the capacitance of the reference capacitor.

11. An electronic device for detecting proximity of a user comprising:

an antenna, wherein a voltage of the antenna is a voltage of a reference capacitor serving as an equivalent circuit for the antenna, the reference capacitor having a capacitance corresponding to at least one capacitor connected to the antenna;
a variable element configured to have a capacitance in a designated range, wherein an upper limit of the designated range is smaller than the capacitance of the reference capacitor; and
an amplifier connected to the variable element and configured to amplify a voltage of the variable element to a voltage of the reference capacitor and output the amplified voltage,
wherein the capacitance of the reference capacitor corresponds to a first change rate of the voltage of the reference capacitor during a designated time interval.

12. The electronic device of claim 11, further comprising a detection circuit including a first input port connected to the antenna and a second input port connected to the amplifier, wherein the detection circuit is configured to:

identify at least two input voltages input to the first input port and the second input port and a difference between the at least two input voltages; and
output an output signal indicating the difference between the at least two input voltages.

13. The electronic device of claim 12, wherein:

one of the at least two input voltages is the amplified voltage of the amplifier; and
an other one of the at least two input voltages is the voltage of the reference capacitor when the electronic device is not close to a user body or a voltage of an equivalent capacitor of the reference capacitor and a capacitor virtually formed by proximity of the user body, when the electronic device is close to the user body.

14. An operation method of an electronic device configured to detect whether a user is close, the operation method comprising:

identifying a change rate during a predetermined time interval of an output voltage of an amplifier configured to amplify, by a designated ratio, a voltage of a variable element configured to have a capacitance in a designated range;
identifying a change rate during the predetermined time interval of a voltage of a reference capacitor serving as an equivalent circuit for an antenna;
determining whether the identified change rate of the output voltage of the amplifier during the predetermined time interval is greater than the change rate of the voltage of the reference capacitor during the predetermined time interval; and
changing the designated ratio of the amplifier in response to determining that the identified change rate of the output voltage of the amplifier during the predetermined time interval is greater than the change rate of the voltage of the reference capacitor during the predetermined time interval.

15. The operation method of claim 14, wherein the changing of the designated ratio of the amplifier comprises repeatedly changing the designated ratio of the amplifier until the identified change rate of the output voltage of the amplifier during the predetermined time interval is smaller than the change rate of the voltage of the reference capacitor during the predetermined time interval.

16. The operation method of claim 15, further comprising, when the change rate of the output voltage of the amplifier during the predetermined time interval is smaller than the change rate of the voltage of the reference capacitor during the predetermined time interval, changing the capacitance of the variable element within the designated range so that a difference between the voltage of the reference capacitor and the output voltage of the amplifier is smaller than a designated threshold value.

17. The operation method of claim 16, further comprising:

identifying, when the difference between the voltage of the reference capacitor and the output voltage of the amplifier is smaller than the designated threshold value, the output voltage of the amplifier, the voltage of the reference capacitor, and the difference between the voltages; and outputting, when the identified difference between the voltages satisfies a designated condition, a signal corresponding to proximity of a user body of the user to the electronic device, wherein, when the electronic device is close to the user body, the voltage of the reference capacitor is a voltage of an equivalent capacitor of the reference capacitor and a capacitor virtually formed by the proximity of the user body.

18. The operation method of claim 14, wherein the designated ratio is changed based on at least one of a representative value of the designated range of the variable element and a capacitance value of the reference capacitor.

19. The operation method of claim 18, wherein the changed designated ratio is a ratio by which the output voltage of the amplifier is synchronized with the voltage of the reference capacitor when the capacitance of the variable element is determined to be the representative value.

\* \* \* \* \*